US012614696B2

(12) United States Patent
Rayner, Jr. et al.

(10) Patent No.: US 12,614,696 B2
(45) Date of Patent: Apr. 28, 2026

(54) ULTRA HIGH PURITY CONDITIONS FOR ATOMIC SCALE PROCESSING

(71) Applicant: Kurt J. Lesker Company, Jefferson Hills, PA (US)

(72) Inventors: Gilbert Bruce Rayner, Jr., Spring Mills, PA (US); Noel Christopher O'Toole, Aliquippa, PA (US); Daniel Edward Carlsen, Canonsburg, PA (US)

(73) Assignee: Kurt J. Lesker Company, Jefferson Hills, PA (US)

( * ) Notice: Subject to any disclaimer, the term of this patent is extended or adjusted under 35 U.S.C. 154(b) by 0 days.

(21) Appl. No.: 18/178,664

(22) Filed: Mar. 6, 2023

(65) Prior Publication Data

US 2023/0230802 A1     Jul. 20, 2023

Related U.S. Application Data

(63) Continuation of application No. 17/288,981, filed as application No. PCT/US2020/045751 on Aug. 11, 2020, now Pat. No. 11,631,571.

(60) Provisional application No. 63/035,014, filed on Jun. 5, 2020, provisional application No. 62/885,446, filed on Aug. 12, 2019.

(51) Int. Cl.
| | |
|---|---|
| *H01J 37/32* | (2006.01) |
| *C23C 16/44* | (2006.01) |
| *C23C 16/455* | (2006.01) |

(52) U.S. Cl.
CPC ........ *H01J 37/321* (2013.01); *C23C 16/4408* (2013.01); *C23C 16/45536* (2013.01); *H01J 37/32715* (2013.01); *H01J 2237/002* (2013.01); *H01J 2237/3322* (2013.01)

(58) Field of Classification Search
CPC ........... H01J 37/32853; H01J 37/32871; H01J 37/32889; H01J 37/32908; H01J 37/32513; C23C 16/4408; C23C 16/52
See application file for complete search history.

(56) References Cited

U.S. PATENT DOCUMENTS

| | | |
|---|---|---|
| 5,368,648 A | 11/1994 | Sekizuka |
| 5,536,330 A | 7/1996 | Chen et al. |

(Continued)

FOREIGN PATENT DOCUMENTS

| | | |
|---|---|---|
| KR | 100225567 B1 | 10/1999 |
| KR | 101011097 B1 | 1/2011 |

OTHER PUBLICATIONS

Rai et al., "Diagnostics for Studying Gas-Surface Reactions During Thermal and Plasma-Assisted Atomic Layer Deposition", Journal of Vacuum Science and Technology, Part A AVS/AIP, Jan. 2012, pp. 1A158-1A158, XP012160377, vol. 30, No. 1.

*Primary Examiner* — Joseph A Miller, Jr.
(74) *Attorney, Agent, or Firm* — The Webb Law Firm

(57) ABSTRACT

An apparatus for atomic scale processing is provided. The apparatus may include a reactor and an inductively coupled plasma source. The reactor may have inner and outer surfaces such that a portion of the inner surfaces define an internal volume of the reactor. The internal volume of the reactor may contain a fixture assembly to support a substrate wherein the partial pressure of each background impurity within the internal volume may be below $10^{-6}$ Torr to reduce the role of said impurities in surface reactions during atomic scale processing.

17 Claims, 21 Drawing Sheets

(56)  References Cited

U.S. PATENT DOCUMENTS

| | | | |
|---|---|---|---|
| 5,721,021 A * | 2/1998 | Tobe | H01J 37/32082 |
| | | | 427/574 |
| 5,908,504 A | 6/1999 | Hanley | |
| 5,928,428 A | 7/1999 | Horie | |
| 6,165,313 A | 12/2000 | Winters et al. | |
| 6,689,222 B2 | 2/2004 | Titel et al. | |
| 6,833,322 B2 | 12/2004 | Anderson et al. | |
| 7,651,568 B2 | 1/2010 | Ishizaka et al. | |
| 7,737,035 B1 | 6/2010 | Lind et al. | |
| 7,964,040 B2 | 6/2011 | Rasheed et al. | |
| 8,021,488 B2 | 9/2011 | Tanaka | |
| 8,231,731 B2 | 7/2012 | Suzaki et al. | |
| 8,293,646 B2 | 10/2012 | Ozaki et al. | |
| 8,454,749 B2 | 6/2013 | Li | |
| 8,784,563 B2 | 7/2014 | Schmidt et al. | |
| 8,858,713 B2 | 10/2014 | Villette et al. | |
| 9,121,502 B2 | 9/2015 | Duclos | |
| 9,340,874 B2 | 5/2016 | Halpin et al. | |
| 9,567,671 B2 | 2/2017 | Knaapen et al. | |
| 9,683,290 B2 | 6/2017 | Honma | |
| 9,695,510 B2 | 7/2017 | Rayner, Jr. | |
| 9,779,978 B2 | 10/2017 | Sakata et al. | |
| 9,895,727 B2 | 2/2018 | Nakamura et al. | |
| 9,916,976 B2 | 3/2018 | Ushida et al. | |
| 9,972,501 B1 | 5/2018 | Kuyel | |
| 10,036,092 B2 | 7/2018 | Kogura et al. | |
| 10,049,911 B2 | 8/2018 | Swaminathan et al. | |
| 10,094,486 B2 | 10/2018 | Sankarakrishnan et al. | |
| 10,153,156 B2 | 12/2018 | Tsai et al. | |
| 10,177,024 B2 | 1/2019 | Gomm et al. | |
| 10,221,478 B2 | 3/2019 | Narushima et al. | |
| 10,351,954 B2 | 7/2019 | Levy | |
| 10,373,831 B2 | 8/2019 | Yu et al. | |
| 10,385,455 B2 | 8/2019 | Iizuka | |
| 10,407,773 B2 | 9/2019 | LaVoie et al. | |
| 2001/0000160 A1 | 4/2001 | Schwaiger et al. | |
| 2003/0113986 A1 * | 6/2003 | Sakamoto | C30B 29/32 |
| | | | 438/584 |
| 2005/0147742 A1 * | 7/2005 | Kleshock | H01J 37/32522 |
| | | | 428/685 |
| 2005/0257744 A1 * | 11/2005 | Boardman | C23C 14/046 |
| | | | 118/723 MW |
| 2006/0213437 A1 | 9/2006 | Ishizaka et al. | |
| 2007/0157683 A1 | 7/2007 | Li | |
| 2007/0231485 A1 | 10/2007 | Moffat et al. | |
| 2009/0047204 A1 * | 2/2009 | Kim | C23C 16/4401 |
| | | | 423/349 |
| 2009/0120368 A1 | 5/2009 | Lubomirsky et al. | |
| 2009/0120464 A1 * | 5/2009 | Rasheed | H01J 37/32834 |
| | | | 118/728 |
| 2012/0145724 A1 | 6/2012 | Kobinata | |
| 2013/0019960 A1 | 1/2013 | Choi et al. | |
| 2014/0004022 A1 * | 1/2014 | Sagona | C23C 16/54 |
| | | | 422/558 |
| 2015/0059910 A1 | 3/2015 | Honda et al. | |
| 2015/0110959 A1 | 4/2015 | Ashizawa et al. | |
| 2015/0376785 A1 | 12/2015 | Knaapen et al. | |
| 2016/0002775 A1 | 1/2016 | Lee | |
| 2016/0376705 A1 | 12/2016 | Phillips et al. | |
| 2017/0051405 A1 | 2/2017 | Fukazawa et al. | |
| 2017/0058404 A1 | 3/2017 | Dieguez-Campo et al. | |
| 2017/0062191 A1 | 3/2017 | Zafiropoulo et al. | |
| 2017/0069473 A1 | 3/2017 | Saito et al. | |
| 2017/0088952 A1 | 3/2017 | Hawryluk | |
| 2017/0137942 A1 | 5/2017 | Kikuchi et al. | |
| 2017/0298509 A1 | 10/2017 | DuBois et al. | |
| 2017/0309455 A1 | 10/2017 | Yoshimura et al. | |
| 2018/0003778 A1 * | 1/2018 | Miyazawa | C23C 14/18 |
| 2018/0105932 A1 | 4/2018 | Fenwick et al. | |
| 2018/0148834 A1 | 5/2018 | Kamimura et al. | |
| 2018/0179627 A1 | 6/2018 | Yamasaki et al. | |
| 2018/0208469 A1 | 7/2018 | Rennschmid et al. | |
| 2018/0315626 A1 | 11/2018 | Franklin | |
| 2018/0363136 A1 | 12/2018 | Spencer, II et al. | |
| 2019/0035646 A1 | 1/2019 | Nasman et al. | |
| 2019/0035654 A1 | 1/2019 | Saido et al. | |
| 2019/0062906 A1 | 2/2019 | Zhao et al. | |
| 2019/0112704 A1 | 4/2019 | Sung et al. | |
| 2019/0112707 A1 | 4/2019 | Liu | |

* cited by examiner

40

42

44

46

14

28

Y

102

$n_i$ $n$ $n_e$ x(cm)

w

104

106

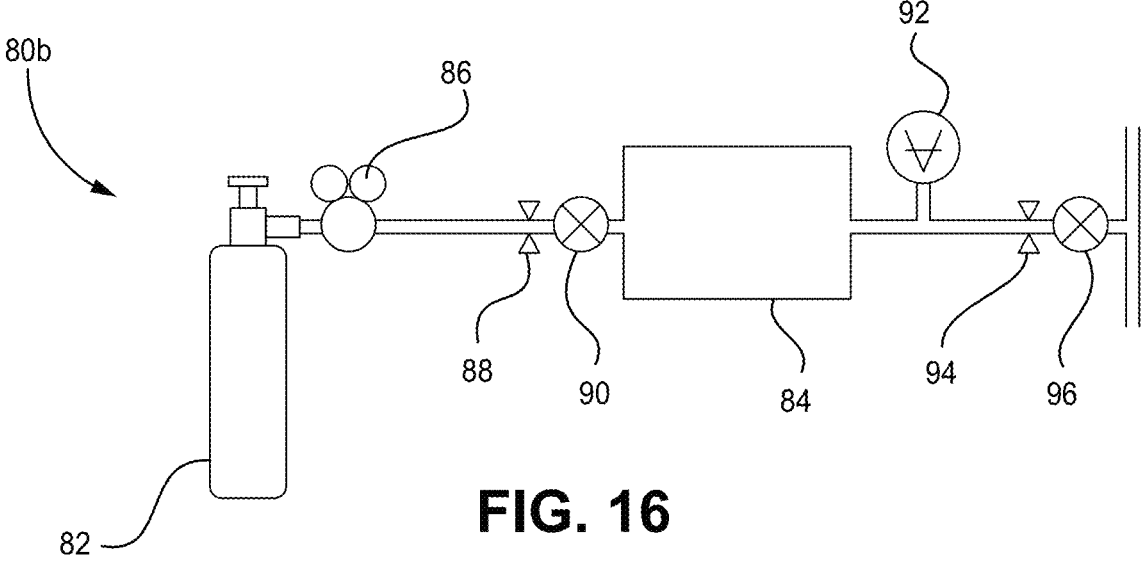
FIG. 16
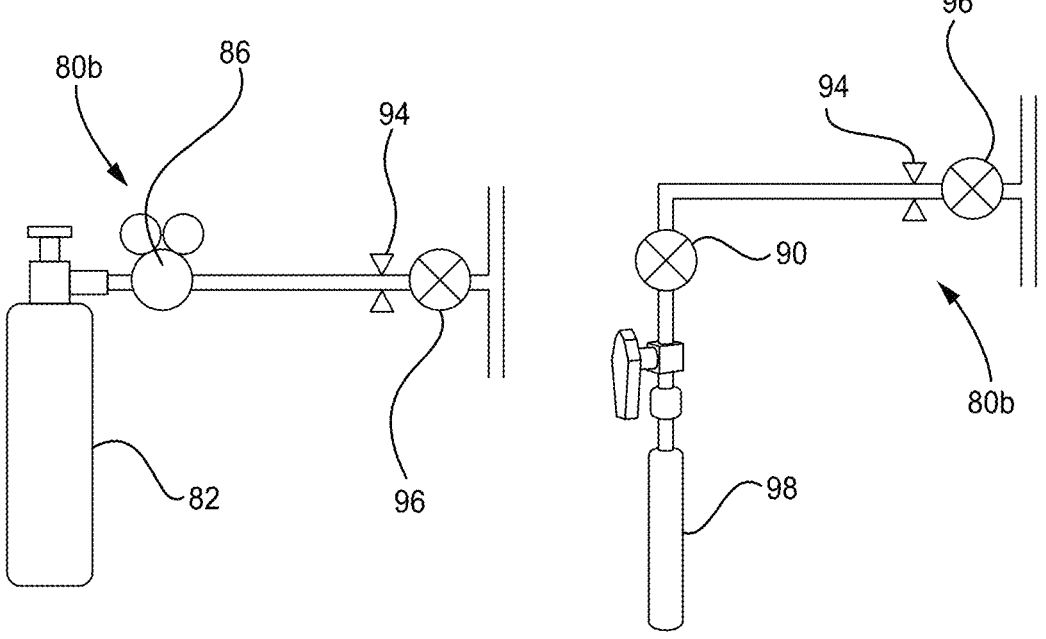
FIG. 17          FIG. 18

1

ULTRA HIGH PURITY CONDITIONS FOR ATOMIC SCALE PROCESSING

CROSS REFERENCE TO RELATED APPLICATIONS

This application is a continuation of U.S. patent application Ser. No. 17/288,981 filed Aug. 11, 2020, which is the United States national phase of International Application No. PCT/US2020/045751 filed Aug. 11, 2020, and claims the benefit of U.S. Provisional Patent Application Nos. 62/885,446 and 63/035,014, filed Aug. 12, 2019 and Jun. 5, 2020, respectively, the disclosures of which are hereby incorporated by reference in their entireties.

BACKGROUND OF THE INVENTION

Field of the Invention

The present disclosure is directed to atomic scale processing and, more particularly, to methods for reducing and/or controlling the partial pressure of background species in plasma based atomic scale processing as well as plasma based atomic scale processing under ultra-high purity (UHP) conditions.

Description of Related Art

Atomic scale processing techniques are of considerable interest for a wide range of electronic applications including logic, memory, power and optoelectronic devices. These techniques include atomic layer deposition (ALD), atomic layer etching (ALE), and area selective ALD (ASALD). Due to the surface controlled nature of atomic scale processing, maintaining a consistent, highly controlled environment is necessary for achieving consistent, reproducible process results. UHP conditions are based on reduced levels of background impurities within the process environment to reduce their role in surface reactions associated with the various atomic scale processing techniques. This includes species that contain oxygen (e.g., molecular oxygen ($O_2$) and water ($H_2O$)). UHP process conditions also provide an ideal environment for delivery and precision control of supplemental gas and/or vapor phase precursors thereby enabling enhanced atomic scale process capabilities.

ALD is a chemical vapor deposition (CVD) technique based on sequential, self-limiting surface reactions between gas/vapor phase species and active surface sites. The unique surface-controlled nature of ALD make it an ideal choice for demanding applications requiring conformal, high-quality oxide and non-oxide based materials, as well as their interfaces. For example, gate stack fabrication (i.e., high-k dielectric and metal gate) by ALD techniques for three dimensional (3D) gate-all-around field effect transistor (GAAFET) device architectures for sub-10 nm technology nodes. ALD techniques include purely thermal and plasma enhanced ALD (PEALD). A limitation associated with current PEALD reactor designs is the undesirable incorporation of oxygen during growth of non-oxide based materials, especially materials with a high affinity for oxygen, such as titanium nitride ($TiN_x$), aluminum nitride ($AlN_x$), silicon nitride ($SiN_x$), aluminum (Al), Titanium (Ti), tantalum (Ta), and the like. Due to the relatively slow deposition rates of materials grown by PEALD, non-oxide processes have long suffered from high exposures to background oxygen impurities, such as $O_2$ and/or $H_2O$, during growth yielding elevated levels of oxygen impurities in the resulting layers. UHP conditions address this longstanding issue by reducing the levels of background oxygen, as well as other impurities, to limit exposures before, during and after film growth.

In contrast to the reduction of background species, the selective addition of species (or precursors) to a UHP background can be used modify surface chemistry during ALD for enhanced process capability. These surface modifications include the removal (e.g., removal of carbon impurities) and/or incorporation (e.g., oxygen doping) of specific elements during film growth. In this case, maintaining precise control over the supplemental precursor background level is vital. For example, control of the precursor partial pressure determines the exposure and subsequent amount of material (or dopant) incorporated. Since surface chemistry drives dopant incorporation, it is necessary to maintain precise control of the precursor partial pressure to achieve the desired dopant level in the deposited film.

ALE is another atomic scale processing technique that benefits from UHP conditions. Unlike ALD techniques which are based on layer-by-layer growth, ALE techniques remove (or etch) material one layer at a time. More specifically, ALE techniques remove thin-modified surface layers with atomic scale control. At present, ALE is primarily motivated by limitations of traditional reactive ion etch (RIE) techniques for technology nodes below 10 nm. In addition to the use of ALE for defining critical device structures and patterning, a combination of ALD/PEALD and ALE techniques has been shown to effectively reduce surface roughness through growth and subsequent etch steps. For example, nucleation delay during the initial stages of growth can result in 3D island formation which leads to high surface roughness, as well as the inability to grow thin, continuous layers. Through a series of growth and etch steps, however, extremely smooth, thin, continuous layers can be achieved. Similar to ALD, the selective addition of precursors to a UHP background can also modify surface chemistry during purely thermal and plasma based ALE. These modifications include removal and/or incorporation of specific elements during surface modification and subsequent removal steps for improved etch performance.

ASALD also benefits from UHP conditions. ASALD is an ALD technique that takes advantage of differences in precursor reactivity between different starting surfaces to enable selective growth. ASALD is a bottom-up approach enabling self-alignment of features during growth thereby addressing edge placement errors associated with traditional patterning techniques. Ideally, deposition would only occur on designated growth areas, but this is frequently not the case, such that ASALD often requires a combination of ALD/PEALD and ALE process steps to ensure the desired selectivity. Therefore, the benefits of UHP conditions, including precursor delivery, are also equally applicable to ASALD.

Background impurities in atomic scale processing may originate from the following sources: system leaks, process gases, elastomer permeation, process pump back-diffusion and back-streaming, outgassing, vaporization, and/or plasma etching. A system design and related procedures must address each of these sources to obtain impurity partial pressures below $10^{-6}$ Torr, such that UHP process conditions are achieved. For example, UHP process conditions for atomic scale processing enables background oxygen incorporation below 2 atomic % (at. %), such as below 1 at. % for non-oxide based film growth.

System leaks include atmospheric leaks, internal leaks of process gas and/or vapor across valve seats, and internal leaks due to gas/vapor trapping inside dead-space volumes and/or flow patterns that recirculate inside the reactor (generally referred to as virtual leaks). Routine leak testing of vacuum components identifies and eliminates atmospheric leaks, as well as internal leaks across valve seats. Proper design, manufacturing and assembly procedures proactively address internal leaks due to gas/vapor trapping which can be very difficult to identify.

Process gas impurities can also be a significant source of background contamination. UHP grade (99.999% purity) process gases (e.g., argon (Ar), molecular nitrogen ($N_2$), molecular hydrogen ($H_2$), etc.) can have up to parts-per-million (ppm) levels of impurities such as $O_2$, $H_2O$, carbon monoxide (CO) and carbon dioxide ($CO_2$). At typical process gas pressures ranging from 0.001 to 1 Torr, impurities at the ppm level range from $10^{-9}$ to $10^{-6}$ Torr partial pressure, respectively. However, improper maintenance of the source gas, delivery lines and/or components (e.g., routine gas cylinder changeover) can result in impurity concentrations exceeding the ppm level. To address the potential variability of process gas impurity levels, gas purification can be used to reduce impurities below the parts-per-billion (ppb) level thereby ensuring the requirement for UHP reactor conditions is satisfied (i.e., impurity partial pressures below $10^{-6}$ Torr). To maintain this level of performance, however, it is important to avoid exposure of the purification media to excessive levels of contamination in the process gas which can dramatically shorten the lifetime of the purification media. For example, introduction of excessive levels of $O_2$ and/or $H_2O$ from the atmosphere (or contaminated process gas from the supplier) leads to media degradation resulting in premature failure of the purifier. Therefore, periodic evaluation of the purifier is necessary to ensure performance. Baseline processes sensitive to impurity levels in the process gas are effective at determining if replacement is necessary.

A further source of background impurities in atomic scale processing is through permeation of elastomeric materials. The primary use of elastomeric materials is to create vacuum seals between system components. Elastomers contain small openings (or voids) that enable the diffusion of gases through the bulk of the elastomeric material. This diffusion of gases and/or vapors through elastomeric o-rings becomes a significant factor regarding the introduction of background impurities into the atomic scale processing environment that requires careful consideration. Elastomeric materials consist of large, interwoven molecular chains which results in a microstructure that is more susceptible to permeation compared to alternative metal seals. However, the use of metal seals, while reducing permeation, can result in an undesirable increase in vacuum system cost and complexity.

The permeation of said elastomeric materials, presented in the form of an o-ring, may be represented by the equation $Q=K(A/L)\Delta P$ with units of $cm^3$(STP)/sec (STP implies standard temperature and pressure; i.e., 0° C. (273.15 K) and 1 atm (760 Torr)), where Q is the permeation rate, K is the temperature-dependent permeation coefficient, A is the area through which gas/vapor phase species enter the elastomer, L is the thickness of the material (i.e., the permeation length), and $\Delta P$ is the difference in partial pressure across the elastomer seal for a given species. The aforementioned equation assumes steady-state diffusion and that absorbed molecules do not dissociate. In order to explicitly show temperature dependence, the steady-state permeation rate can be expressed as: $Q=K_o e^{-E/RT}(A/L)\Delta P$, where $K_o$ is a constant, E is the activation energy of diffusion, R is the gas constant, and T is the temperature ($K_o$ and E are gas and material dependent values). In general, the permeation coefficient K increases with temperature, thus increasing the permeation rate of the elastomer.

For a given elastomeric o-ring, the effective area through which gas/vapor phase species enter the elastomer may be represented by $A=\pi Dh$, where D is the diameter of the o-ring and h is the compressed height. Inserting this into the aforementioned permeation rate equation yields the following approximation: $Q\approx K(\pi Dh/L)\Delta P$, where the permeation length L is approximately the compressed width of the o-ring.

For example, let $P_1$ equal the partial pressure of water in the atmosphere at 2% atmospheric pressure (22° C., 75% relative humidity), and let $P_2$ be the water partial pressure in an atomic scale process environment. In this case $P_1 \gg P_2$ such that $\Delta P=P_1-P_2 \approx 15$ Torr. For a fluoroelastomer o-ring, such as a Viton o-ring commercially available from The Chemours Company, the temperature-dependent permeation coefficient for $H_2O$ may be estimated as $K \approx 3.7 \times 10^{-8}$ [($cm^3$(STP)·gas·cm·polymer)/($cm^2$·polymer·sec·Torr)] for the fluoroelastomer o-ring at a temperature of 150° C. A single fluoroelastomer o-ring with a diameter of D=13.6 cm (5.35 inches), d=0.50 cm (0.197 inches), h=0.40 cm (0.157 inches) and L=0.53 cm (0.209 inches), the permeation rate $Q_{Water}$ would equal $1.8 \times 10^{-5}$ $cm^3$(STP)/sec (or $2.1 \times 10^{-5}$ Torr·Liters/sec). For an effective pumping speed $S_{eff}$ of 21 Liters/sec, the background water partial pressure $P_{Water}$ is $\sim 10^{-6}$ Torr ($P_{Water}=Q_{Water}/S_{eff}$), or $\sim 1$ Langmuir exposure every second. In order to achieve UHP conditions, background impurities due to elastomeric permeation must be reduced below $10^{-6}$ Torr partial pressure.

Another source of background impurities and contamination is process pump back-diffusion and back-streaming of atmosphere, and other impurities condensed and/or deposited inside the pump. Oil-sealed mechanical pumps include pump oil, as well as pump oil vapors as potential sources of impurities. Pump oils generally contain hydrocarbon species and, in the case of perfluoropolyether type oils, contain carbon, fluorine, and oxygen. Although dry mechanical pumps may be implemented to eliminate pump oil concerns, said pumps still generate back-diffusion/streaming of impurities condensed and/or deposited on internal pump surfaces.

Additional sources of background impurities are outgassing and vaporization. Outgassing/vaporization can also be considered as another type of virtual leak. Outgassing includes desorption of species absorbed on internal surfaces from one to several layers thick which can be thermally activated, or stimulated by alternative energy sources, such as plasma exposure. Outgassing further refers to diffusion and subsequent desorption of absorbed elements or compounds within reactor walls and internal fixtures. Vaporization includes the transition of a liquid or solid phase substance to the vapor phase. For liquids and solids, vaporization may also be referred to as evaporation and sublimation, respectively. In general, outgassing and vaporization rates increase with an increase in temperature.

During atomic scale processing, liquid and/or solid phase precursors (or reactants) are routinely vaporized and transported via delivery source to a reaction space containing a substrate. A vapor delivery arrangement generally includes a precursor ampoule, valving, and a line to the reactor including stainless-steel tubing and various metal seal connections. Moreover, a vapor delivery arrangement also includes means of providing continuous, viscous-laminar inactive gas flow through the vapor delivery channel. For example, a mass flow controller (MFC) may be used to control the continuous flow of inactive Ar or $N_2$ process gas through the valving and the line to the reactor. Continuous, viscous-laminar inactive gas flow serves as a carrier gas during precursor delivery/dose steps, and as a purge gas during subsequent purge steps. This inactive gas flow also creates a diffusion barrier to prevent unwanted back-diffusion of downstream impurities into the vapor delivery channel. In addition to continuous, viscous-laminar flow of inactive carrier/purge gas, heating of delivery source components is essential to prevent long residence times due to precursor adsorption, as well as condensation (vapor-to-liquid transition) or deposition (vapor-to-solid transition) within the delivery channel. In many cases, effective vapor delivery also requires heating of the liquid/solid phase precursor itself to increase its vapor pressure. During precursor dose and purge steps, the temperature must be sufficiently high and uniform to minimize the residence time within the delivery channel. If purging is not complete between precursor dose steps, outgassing/vaporization of material within the delivery channel results in an unwanted source of background impurities where related issues include parasitic chemical vapor deposition effects, particulates, clogging of delivery components and process cross contamination. Process cross contamination results in unwanted impurities in films grown by ALD/PEALD techniques. Careful heating of the delivery components helps to avoid these common issues.

A further source of background impurities is plasma etching. Plasma source design and its construction are important considerations in plasma based atomic scale processing. Common plasma configurations include direct and remote capacitively coupled plasma (CCP), and remote inductively coupled plasma (ICP) designs. Inductive, radio frequency (RF) sources operating at 13.56 megahertz (MHz) are routinely used to generate plasma in atomic scale processing. Remote ICP sources provide good plasma uniformity and a modular design for ease of service. Further, remote ICP sources have an external located electrode to eliminate the potential for etching of the metallic surface. However, chemical and/or physical (or sputter) etching of the dielectric surfaces used for signal transmission can be a source of background impurities. Fused silica is a common dielectric material for RF signal transmission; however, the use of fused silica may result in etching of the dielectric surface which is a source of oxygen and silicon background impurities.

In general, background impurity levels may be substantially reduced by lowering the base pressure of the vacuum apparatus (or reactor) used for growth and/or etch by atomic scale processing techniques. More specifically, the reactor base pressure may be lowered by increasing the pumping speed of the pump used for achieving process vacuum according the relationship $P=Q/S_{eff}$ where P is the reactor pressure (Torr), Q is the throughput (Torr·Liters/sec) and $S_{eff}$ is the effective pumping speed (Liters/sec). The base pressure corresponds to the vacuum level in the reactor without any process gas actively flowing. In this case, the pressure P is the sum of all background component partial pressures, which is proportional to the associated throughput Q. The proportionality constant is ($1/S_{eff}$) such that increasing the effective pumping speed lowers the base pressure in the reactor. Mechanical pumps enable a minimum base pressure of approximately $10^{-2}$ to $10^{-4}$ Torr. To achieve a base pressure below $10^{-6}$ Torr, turbomolecular pumps are commonly utilized. If sufficient gas flow and reactor pressure are not maintained during processing, however, unwanted precursor exposure and subsequent film deposition on critical/sensitive surface inside the reactor may occur. Unwanted deposition occurs as a result of an insufficient diffusion barrier to protect critical/sensitive surfaces during precursor dose and purge steps. For example, deposition of a thin, highly conductive $TiN_x$ layer on dielectric surfaces used for RF signal transmission during PEALD results in signal attenuation followed by loss of plasma.

Diffusion barrier performance is highly dependent on geometry, pressure and gas flow rate. To create an effective diffusion barrier, gas flow must be viscous and laminar. A general requirement for viscous flow is that characteristic reactor dimensions (e.g., cylindrical tube diameter) should exceed ~100× the mean free path λ of the background process gas. For Ar process gas at 1 Torr pressure (gas temperature=150° C.) the mean free path is ~0.003 inches (0.08 mm). In this case, characteristic dimensions of the reactor should be >0.3 inches (0.8 cm) to ensure viscous flow conditions. If the pressure is reduced to 0.1 Torr, then critical reactor dimensions should exceed 3 inches (8 cm). For cylindrical, or tubular, reactor geometries at 0.1 Torr pressure, the diameter should exceed 3 inches to ensure the flow is viscous. Typical reactors for atomic scale processing, therefore, require process pressures exceeding a few hundred mTorr to ensure viscous flow conditions through the reactor, as well as associated ports/features (e.g., ports/features for substrate transfer, in-situ ellipsometry and inductive plasma). For process pressures above approximately 100 mTorr (0.1 Torr), turbomolecular pumping speeds dramatically decrease to levels at or below typical mechanical pumps with pumping speeds ranging from approximately 5 to 50 Liters/sec. In addition to gas flow that is viscous, the flow rate must be high enough to prevent back-diffusion of unwanted species within the channel. At pressures required for viscous flow (e.g., above 0.2-0.3 Torr), as well as gas flow rates necessary to create an effective diffusion barrier, mechanical pumps have the advantage of maintaining their pumping speed with minimal variation. Finally, viscous flow is laminar (vs. turbulent) when the Reynold's number is below 1100 (i.e., $R_e$<1100). Based on typical atomic scale process conditions (i.e., temperatures, gas flow rates, pressures), $R_e$<<1100 for cylindrical geometries thereby satisfying the condition for viscous-laminar flow.

Therefore, a method for reducing and/or controlling the partial pressure of background species in atomic scale processing, including the reduction of background species caused by any of the aforementioned sources of background impurities, is desirable. Additionally, an atomic scale processing apparatus that includes components for reducing and/or controlling the partial pressure of background species during processing is also desirable.

SUMMARY OF THE INVENTION

In view of the foregoing, there is a current need in the art for a method to reduce and/or control the partial pressure of background species during atomic scale processing. In further view of the foregoing, there is a current need in the art for an atomic scale processing apparatus with reduced background species (or impurities), as well as the ability to selectively add species (or precursors) to modify surface chemistry thereby enhancing atomic scale process capabilities.

In one non-limiting example of the present disclosure, an apparatus for atomic scale processing includes: a reactor having inner and outer surfaces; where at least a portion of the inner surfaces define an internal volume of the reactor; a fixture assembly positioned within the internal volume of the reactor having a surface configured to hold a substrate within the internal volume of the reactor; and an inductively coupled plasma source; where the inductively coupled plasma source and the reactor are connected at a first connection point; where the first connection point comprises a first elastomeric seal and a second elastomeric seal spaced apart from the first elastomeric seal to define a first volume therebetween; and where the first volume is a vacuum, or the first volume is actively purged and/or backfilled with a process gas.

The apparatus may further include a process gas source; where the process gas source and the inductively coupled plasma source are connected at a second connection point; where the second connection point comprises a third elastomeric seal and a fourth elastomeric seal spaced apart from the third elastomeric seal to define a second volume therebetween; and where the second volume is a vacuum, or the second volume is actively purged and/or backfilled with a process gas. A continuous, inactive gas flow may be maintained from the process gas source to the ICP source and the reactor. The inductively coupled plasma source may include a cooling arrangement; where the cooling arrangement provides active cooling at the first and second connection points. The cooling arrangement may include one or more heat sinks. The cooling arrangement may include one or more water-cooled base plates. The cooling arrangement may include one or more water-cooled mounting flanges. The cooling arrangement may include a cooling fan. The cooling arrangement may include one or more water-cooled enclosure panels. The apparatus may be configured such that all remaining connection points spatially located between the first connection point and the fixture assembly include metallic and/or elastomeric seals; where each elastomeric seal connection point includes at least two elastomeric seals spaced apart to define a volume therebetween; and where the volume is a vacuum, or the volume is actively purged and/or backfilled with a process gas. The apparatus may include an exhaust port from the reactor to a pump isolation valve and a foreline from the pump isolation valve to a pump; where a continuous gas flow is maintained in the exhaust port and the foreline when the pump is on, the pump isolation valve is open, and the reactor is in communication with the pump. The apparatus may include a downstream port attached to the foreline; where the downstream port is configured to provide continuous gas flow to the foreline when the pump is on, the pump isolation valve is closed, and the reactor is not in communication with the pump. The downstream port may be further configured to provide gas flow that rapidly brings the foreline to atmospheric pressure when the pump isolation valve is closed and the pump is turned off. The inductively coupled plasma source may include a dielectric tube, and where the dielectric tube comprises fused silica, ceramic alumina, sapphire, or a combination thereof. The apparatus may further include at least one precursor vapor delivery arrangement in communication with the reactor. A continuous, inactive gas flow may be maintained from the at least one precursor vapor delivery arrangement to the reactor. At least one of the at least one precursor vapor delivery arrangements may include a cladding around at least a portion of the precursor vapor delivery arrangement. The cladding may be aluminum cladding, or some other suitable thermal mass with sufficient thermal conductivity. At least one of the at least one precursor vapor delivery arrangements may include at least one heater jacket, or some other suitable means of supplying thermal energy, around at least a portion of the precursor vapor delivery arrangement. At least one of the at least one precursor vapor delivery arrangements may include at least one independently controlled heat zone. The reactor may include a cladding around at least a portion of the reactor. The cladding may be aluminum cladding, or some other suitable thermal mass with sufficient thermal conductivity. The reactor may include at least one heater jacket, or some other suitable means of supplying thermal energy, around at least a portion of the reactor. The reactor may include at least one independently controlled heat zone. The apparatus may further include at least one gas purification arrangement between the reactor and at least one source of process gas. The apparatus may further include a mechanical pump with a nominal pumping speed of approximately 5 to 50 Liters/sec. A base pressure of the reactor may be between approximately $10^{-4}$ and $10^{-2}$ Torr. A partial pressure of each background impurity within the internal volume of the reactor may be below approximately $10^{-6}$ Torr to reduce said background impurities role in surface reactions before, during, and after atomic scale processing. The apparatus may further include at least one precursor gas or vapor delivery arrangement for supplying a precursor gas or vapor to the internal volume of the reactor, and controlling the background partial pressure of said precursor gas and vapor, including: a compressed gas cylinder or an ampoule; a reservoir and pressure gauge in communication with the compressed gas cylinder or the ampoule and the reactor; where a regulator, a first orifice, and a first valve are provided between the compressed gas cylinder or the ampoule and the reservoir and pressure gauge; system control software in communication with the pressure gauge and the first valve; where the system control software receives feedback from the pressure gauge and cycles the first valve based on said feedback to control flow from the compressed gas cylinder or the ampoule into the reservoir; where a second orifice and a second valve are provided between the reservoir, pressure gauge and the reactor to control the flow of the precursor gas or vapor from the reservoir to the reactor. The apparatus may further include at least one precursor gas or vapor delivery arrangement for supplying a precursor gas or vapor to the internal volume of the reactor, and controlling the background partial pressure of said precursor gas or vapor, including: a compressed gas cylinder or an ampoule in communication with the reactor; where a regulator, an orifice, and a valve are provided between the compressed gas cylinder or the ampoule and the reactor to control the flow of precursor gas or vapor from the compressed gas cylinder or the ampoule to the reactor. The apparatus may further include at least one precursor vapor delivery arrangement for supplying a precursor vapor to the internal volume of the reactor, and controlling the background partial pressure of said precursor vapor, including: an ampoule in communication with the reactor; where an orifice and a valve are provided between the ampoule and the reactor to control the flow of precursor vapor from the ampoule to the reactor.

In another non-limiting example of the present disclosure, a method of reducing background impurities during atomic scale processing includes: providing a reactor having inner and outer surfaces, where at least a portion of the inner surfaces define an internal volume of the reactor; providing a fixture assembly positioned within the internal volume of the reactor having a surface configured to hold a substrate within the internal volume of the reactor; providing a first elastomeric seal and a second elastomeric seal at a first connection point between an inductively coupled plasma source and the reactor; establishing a first volume defined between the first elastomeric seal and second elastomeric seal; and applying a vacuum to the first volume, or actively purging and/or backfilling the first volume with a process gas, to lower an atmospheric partial pressure within the first volume.

The method may further include providing a third elastomeric seal and a fourth elastomeric seal at a second connection point between the inductively coupled plasma source and a process gas source; establishing a second volume defined between the third elastomeric seal and the fourth elastomeric seal; and applying a vacuum to the second volume, or actively purging and/or backfilling the second volume with a process gas, to lower an atmospheric partial pressure within the second volume. The method may further include maintaining a continuous, inactive gas flow from the process gas source to the ICP source and the reactor. The method may further include providing a cooling arrangement in the inductively coupled plasma source which provides active cooling to prevent thermal damage to the elastomeric seals at the first and second connection points. The cooling arrangement may include one or more heat sinks. The cooling arrangement may include one or more water-cooled base plates. The cooling arrangement may include one or more water-cooled mounting flanges. The cooling arrangement may include a cooling fan. The cooling arrangement may include one or more water-cooled enclosure panels. The method may further include providing metallic and/or elastomeric seals at all remaining connection points spatially located between the first connection point and the fixture assembly; where each elastomeric seal connection point includes at least two elastomeric seals spaced apart to define a volume therebetween; and where the volume is a vacuum, or the volume is actively purged and/or backfilled with a process gas, to lower an atmospheric partial pressure within the volume. The method may further include providing an exhaust port in communication with the reactor and a pump isolation valve; providing a foreline in communication with the pump isolation valve and a pump; and maintaining a continuous gas flow in the exhaust port and the foreline when the pump is on, the pump isolation valve is open, and the reactor is in communication with the pump to prevent back-diffusion of impurities from the foreline and/or pump into the internal volume of the reactor. The method may further include establishing a downstream port in communication with the foreline; and maintaining continuous gas flow to the foreline when the pump is on, the pump isolation valve is closed, and the reactor is not in communication with the pump to prevent back-diffusion of impurities from the pump into the foreline. The method may further include providing gas flow which rapidly brings the foreline to atmospheric pressure when the pump isolation valve is closed and the pump is turned off to prevent back-streaming of impurities from the pump into the foreline. The inductively coupled plasma source may include a dielectric tube, where the dielectric tube may include fused silica, ceramic alumina, sapphire, or a combination thereof to substantially eliminate etching of the dielectric tube surface. The method may further include establishing communication between at least one precursor vapor delivery arrangement and the reactor. The method may further include maintaining a continuous, inactive gas flow from the at least one precursor vapor delivery arrangement to the reactor. At least one of the at least one precursor vapor delivery arrangements may include cladding around at least a portion of the precursor vapor delivery arrangement. The cladding may be aluminum cladding, or some other suitable thermal mass with sufficient thermal conductivity. At least one of the at least one precursor vapor delivery arrangements may include at least one heater jacket, or some other suitable means of supplying thermal energy, around at least a portion of the precursor vapor delivery arrangement. The method may further include establishing at least one independently controlled heat zone on at least one of the at least one precursor vapor delivery arrangements to substantially reduce the residence time of precursor vapors on surfaces within the precursor vapor delivery arrangement. The reactor may include a cladding around a least a portion of the reactor. The cladding may be aluminum cladding, or some other suitable thermal mass with sufficient thermal conductivity. The reactor may include at least one heater jacket, or some other suitable means of supplying thermal energy, around at least a portion of the reactor. The method may further include establishing at least one independently controlled heat zone to substantially reduce the residence time of precursor gases, vapors and/or reaction byproducts on surfaces within the internal volume of the reactor. The method may further include providing at least one gas purification arrangement between the reactor and at least one source of process gas to substantially reduce said process gas impurity levels. The method may further include providing a mechanical pump with a nominal pumping speed of approximately 5 to 50 Liters/sec. A base pressure of the reactor may be between approximately $10^{-4}$ and $10^{-2}$ Torr. A partial pressure of each background impurity within the internal volume of the reactor may be below approximately $10^{-6}$ Torr.

In another non-limiting example of the present disclosure, a method of selectively adding precursor gas or vapor to an ultra-high purity background and controlling the partial pressure of said precursor gas or vapor includes: providing a reactor for atomic layer processing; providing at least one supplemental precursor gas or vapor delivery arrangement in communication with the reactor; establishing an ultra-high purity level within an internal volume of the reactor; selectively adding precursor gas or vapor into the internal volume of the reactor once the ultra-high purity level has been achieved; and controlling a background partial pressure of said precursor gas or vapor within the internal volume of the reactor.

In another non-limiting example of the present disclosure, an apparatus for supplying precursor gas or vapor to an ultra-high purity background and controlling the partial pressure of said precursor gas or vapor includes: a reactor having inner and outer surfaces; where at least a portion of the inner surfaces define an internal volume of the reactor, and where an ultra-high purity level is established within the internal volume of the reactor; a fixture assembly positioned within the internal volume of the reactor having a surface configured to hold a substrate within the internal volume of the reactor; at least one primary precursor gas or vapor delivery arrangement; and at least one supplemental precursor gas or vapor delivery arrangement.

The at least one primary precursor gas or vapor delivery arrangement may be configured to sequentially supply the reactor with a precursor gas or vapor, and the supplemental precursor gas or vapor delivery arrangement may be configured to continuously supply the reactor with a precursor gas or vapor. The at least one supplemental precursor gas or vapor delivery arrangement may include: a compressed gas cylinder or an ampoule in communication the reactor; and a reservoir and pressure gauge between the compressed gas cylinder or the ampoule and the reactor. The at least one supplemental precursor gas or vapor delivery arrangement may further include: a regulator between the compressed gas cylinder or the ampoule and the reservoir and pressure gauge; a first orifice between the regulator and the reservoir and pressure gauge; and a first valve between the first orifice and the reservoir and pressure gauge. The at least one supplemental precursor gas or vapor delivery arrangement may further include: a second orifice between the reservoir and pressure gauge and the reactor; and a second valve between the second orifice and the reactor; where the second orifice and the second valve control the flow of precursor gas or vapor from the reservoir to the reactor. The apparatus may further include system control software in communication with the pressure gauge and the first valve; where the system control software receives feedback from the pressure gauge and cycles the first valve based on the feedback to control flow into the reservoir. The at least one supplemental precursor gas or vapor delivery arrangement may include: a compressed gas cylinder or an ampoule in communication the reactor; where a regulator, an orifice, and a valve are provided between the compressed gas cylinder or ampoule and the reactor to control the flow of a precursor gas or vapor from the compressed gas cylinder or the ampoule to the reactor. The at least one supplemental precursor vapor delivery arrangement may further include: an ampoule in communication with the reactor; where an orifice and a valve are provided between the ampoule and the reactor to control the flow of precursor vapor from the ampoule to the reactor.

Various preferred and non-limiting examples or aspects of the present invention will now be described and set forth in the following numbered clauses:

Clause 1: an apparatus for atomic scale processing comprises: a reactor having inner and outer surfaces; wherein at least a portion of the inner surfaces define an internal volume of the reactor; a fixture assembly positioned within the internal volume of the reactor having a surface configured to hold a substrate within the internal volume of the reactor; and an inductively coupled plasma source; wherein the inductively coupled plasma source and the reactor are connected at a first connection point; wherein the first connection point comprises a first elastomeric seal and a second elastomeric seal spaced apart from the first elastomeric seal to define a first volume therebetween; and wherein the first volume is a vacuum, or the first volume is actively purged and/or backfilled with a process gas.

Clause 2: the apparatus of clause 1, further comprising: a process gas source; wherein the process gas source and the inductively coupled plasma source are connected at a second connection point; wherein the second connection point comprises a third elastomeric seal and a fourth elastomeric seal spaced apart from the third elastomeric seal to define a second volume therebetween; and wherein the second volume is a vacuum, or the second volume is actively purged and/or backfilled with a process gas.

Clause 3: the apparatus of clause 2, wherein the inductively coupled plasma source comprises a cooling arrangement; wherein the cooling arrangement provides active cooling at the first and second connection points.

Clause 4: the apparatus of clause 3, wherein the cooling arrangement comprises one or more heat sinks.

Clause 5: the apparatus of any of clauses 3-4, wherein the cooling arrangement comprises one or more water-cooled base plates.

Clause 6: the apparatus of any of clauses 3-5, wherein the cooling arrangement comprises one or more water-cooled mounting flanges.

Clause 7: the apparatus of any of clauses 3-6, wherein the cooling arrangement comprises a cooling fan.

Clause 8: the apparatus of any of clauses 3-7, wherein the cooling arrangement comprises one or more water-cooled enclosure panels.

Clause 9: the apparatus of any of clauses 1-8, wherein all remaining connection points spatially located between the first connection point and the fixture assembly comprise metallic and/or elastomeric seals; wherein each elastomeric seal connection point comprises at least two elastomeric seals spaced apart to define a volume therebetween; and wherein the volume is a vacuum, or the volume is actively purged and/or backfilled with a process gas.

Clause 10: the apparatus of any of clauses 1-9, further comprising an exhaust port from the reactor to a pump isolation valve and a foreline from the pump isolation valve to a pump; wherein a continuous gas flow is maintained in the exhaust port and the foreline when the pump is on, the pump isolation valve is open, and the reactor is in communication with the pump.

Clause 11: the apparatus of clause 10, further comprising a downstream port attached to the foreline; wherein the downstream port is configured to provide continuous gas flow to the foreline when the pump is on, the pump isolation valve is closed, and the reactor is not in communication with the pump.

Clause 12: the apparatus of clause 11, wherein the downstream port is further configured to provide gas flow that rapidly brings the foreline to atmospheric pressure when the pump isolation valve is closed and the pump is turned off.

Clause 13: the apparatus of any of clauses 1-12, wherein the inductively coupled plasma source comprises a dielectric tube, and wherein the dielectric tube comprises fused silica, ceramic alumina, sapphire, or a combination thereof.

Clause 14: the apparatus of any of clauses 1-13, further comprising at least one precursor vapor delivery arrangement in communication with the reactor.

Clause 15: the apparatus of clause 14, wherein at least one of the at least one precursor vapor delivery arrangements comprises a cladding around at least a portion of the precursor vapor delivery arrangement.

Clause 16: the apparatus of clause 15, wherein the cladding is aluminum cladding, or some other suitable thermal mass with sufficient thermal conductivity.

Clause 17: the apparatus of any of clauses 14-16, wherein at least one of the at least one precursor vapor delivery arrangements comprises at least one heater jacket, or some other suitable means of supplying thermal energy, around at least a portion of the precursor vapor delivery arrangement.

Clause 18: the apparatus of any of clauses 14-17, wherein at least one of the at least one precursor vapor delivery arrangements comprise at least one independently controlled heat zone.

Clause 19: the apparatus of any of clauses 1-18, wherein the reactor comprises a cladding around at least a portion of the reactor.

Clause 20: the apparatus of clause 19, wherein the cladding is aluminum cladding, or some other suitable thermal mass with sufficient thermal conductivity.

Clause 21: the apparatus of any of clauses 1-20, wherein the reactor comprises at least one heater jacket, or some other suitable means of supplying thermal energy, around at least a portion of the reactor.

Clause 22: the apparatus of any of clauses 1-21, wherein the reactor comprises at least one independently controlled heat zone.

Clause 23: the apparatus of any of clauses 1-22, further comprising at least one gas purification arrangement between the reactor and at least one source of process gas.

Clause 24: the apparatus of any of clauses 1-23, further comprising a mechanical pump with a nominal pumping speed of approximately 5 to 50 Liters/sec.

Clause 25: the apparatus of any of clauses 1-24, wherein a base pressure of the reactor is between $10^{-4}$ and $10^{-2}$ Torr.

Clause 26: the apparatus of any of clauses 1-25, wherein a partial pressure of each background impurity within the internal volume of the reactor is below approximately $10^{-6}$ Torr to reduce said background impurities role in surface reactions before, during, and after atomic scale processing.

Clause 27: the apparatus of any of clauses 1-26, further comprising at least one precursor gas or vapor delivery arrangement for supplying a precursor gas or vapor to the internal volume of the reactor, and controlling the background partial pressure of said precursor gas or vapor, comprising: a compressed gas cylinder or an ampoule; a reservoir and pressure gauge in communication with the compressed gas cylinder or the ampoule and the reactor; wherein a regulator, a first orifice, and a first valve are provided between the compressed gas cylinder or the ampoule and the reservoir and pressure gauge; system control software in communication with the pressure gauge and the first valve; wherein the system control software receives feedback from the pressure gauge and cycles the first valve based on said feedback to control flow from the compressed gas cylinder or ampoule into the reservoir; wherein a second orifice, and a second valve are provided between the reservoir, pressure gauge and the reactor to control the flow of the precursor gas or vapor from the reservoir to the reactor.

Clause 28: the apparatus of any of clauses 1-27, further comprising at least one precursor gas or vapor delivery arrangement for supplying a precursor gas or vapor to the internal volume of the reactor, and controlling the background partial pressure of said precursor gas or vapor, comprising: a compressed gas cylinder or ampoule in communication with the reactor; wherein a regulator, an orifice, and a valve are provided between the compressed gas cylinder or ampoule and the reactor to control the flow of precursor gas or vapor from the compressed gas cylinder or ampoule to the reactor.

Clause 29: the apparatus of any of clauses 1-28, further comprising at least one precursor vapor delivery arrangement for supplying a precursor vapor to the internal volume of the reactor, and controlling the background partial pressure of said precursor vapor, comprising: an ampoule in communication with the reactor; wherein an orifice and a valve are provided between the ampoule and the reactor to control the flow of precursor vapor from the ampoule to the reactor.

Clause 30: a method of reducing background impurities during atomic scale processing, comprises: providing a reactor having inner and outer surfaces, wherein at least a portion of the inner surfaces define an internal volume of the reactor; providing a fixture assembly positioned within the internal volume of the reactor having a surface configured to hold a substrate within the internal volume of the reactor; providing a first elastomeric seal and a second elastomeric seal at a first connection point between an inductively coupled plasma source and the reactor; establishing a first volume defined between the first elastomeric seal and second elastomeric seal; and applying a vacuum to the first volume, or actively purging and/or backfilling the first volume with a process gas, to lower an atmospheric partial pressure within the first volume.

Clause 31: the method of clause 30, further comprising: providing a third elastomeric seal and a fourth elastomeric seal at a second connection point between the inductively coupled plasma source and a process gas source; establishing a second volume defined between the third elastomeric seal and the fourth elastomeric seal; and applying a vacuum to the second volume, or actively purging and/or backfilling the second volume with a process gas, to lower an atmospheric partial pressure within the second volume.

Clause 32: the method of clause 31, further comprising providing a cooling arrangement in the inductively coupled plasma source which provides active cooling to prevent thermal damage to the elastomeric seals at the first and second connection points.

Clause 33: the method of clause 32, wherein the cooling arrangement comprises one or more heat sinks.

Clause 34: the method of any of clauses 32-33, wherein the cooling arrangement comprises one or more water-cooled base plates.

Clause 35: the method of any of clauses 32-34, wherein the cooling arrangement comprises one or more water-cooled mounting flanges.

Clause 36: the method of any of clauses 32-35, wherein the cooling arrangement comprises a cooling fan.

Clause 37: the method of any of clauses 32-36, wherein the cooling arrangement comprises one or more water-cooled enclosure panels.

Clause 38: the method of any of clauses 30-37, further comprising providing metallic and/or elastomeric seals at all remaining connection points spatially located between the first connection point and the fixture assembly; wherein each elastomeric seal connection point comprises at least two elastomeric seals spaced apart to define a volume therebetween; and wherein the volume is a vacuum, or the volume is actively purged and/or backfilled with a process gas, to lower an atmospheric partial pressure within the volume.

Clause 39: the method of any of clauses 30-38, further comprising: providing an exhaust port in communication with the reactor and a pump isolation valve; providing a foreline in communication with the pump isolation valve and a pump; and maintaining a continuous gas flow in the exhaust port and the foreline when the pump is on, the pump isolation valve is open, and the reactor is in communication with the pump to prevent back-diffusion of impurities from the foreline and/or pump into the internal volume of the reactor.

Clause 40: the method of clause 39, further comprising: establishing a downstream port in communication with the foreline; and maintaining continuous gas flow to the foreline when the pump is on, the pump isolation valve is closed, and the reactor is not in communication with the pump to prevent back-diffusion of impurities from the pump into the foreline.

Clause 41: the method of clause 40, further comprising: providing gas flow which rapidly brings the foreline to atmospheric pressure when the pump isolation valve is closed and the pump is turned off to prevent back-streaming of impurities from the pump into the foreline.

Clause 42: the method of any of clauses 30-41, wherein the inductively coupled plasma source comprises a dielectric tube, wherein the dielectric tube comprises fused silica, ceramic alumina, sapphire, or a combination thereof to substantially eliminate etching of the dielectric tube surface.

Clause 43: the method of any of clauses 30-42, further comprising establishing communication between at least one precursor vapor delivery arrangement and the reactor.

Clause 44: the method of clause 43, wherein at least one of the at least one precursor vapor delivery arrangements comprise cladding around at least a portion of the precursor vapor delivery arrangement.

Clause 45: the method of clause 44, wherein the cladding is aluminum cladding, or some other suitable thermal mass with sufficient thermal conductivity.

Clause 46: the method of any clauses 43-45, wherein at least one of the at least one precursor vapor delivery arrangements comprise at least one heater jacket, or some other suitable means of supplying thermal energy, around at least a portion of the precursor vapor delivery arrangement.

Clause 47: the method of any of clauses 43-46, further comprising establishing at least one independently controlled heat zone on at least one of the at least one precursor vapor delivery arrangements to substantially reduce the residence time of precursor vapors on surfaces within the precursor vapor delivery arrangement.

Clause 48: the method of any of clauses 30-47, wherein the reactor comprises a cladding around a least a portion of the reactor.

Clause 49: the method of clause 48, wherein the cladding is aluminum cladding, or some other suitable thermal mass with sufficient thermal conductivity.

Clause 50: the method of any clauses 48-49, wherein the reactor comprises at least one heater jacket, or some other suitable means of supplying thermal energy, around at least a portion of the reactor.

Clause 51: the method of any of clauses 30-50, further comprising establishing at least one independently controlled heat zone to substantially reduce the residence time of precursor gases, vapors and/or reaction byproducts on surfaces within the internal volume of the reactor.

Clause 52: the method of any of clauses 30-51, further comprising providing at least one gas purification arrangement between the reactor and at least one source of process gas to substantially reduce said process gas impurity levels.

Clause 53: the method of any of clauses 30-52, further comprising providing a mechanical pump with a nominal speed of approximately 5 to 50 Liters/sec.

Clause 54: the method of any of clauses 30-53, wherein a base pressure of the reactor is between approximately $10^{-4}$ and $10^{-2}$ Torr.

Clause 55: the method of any of clauses 30-54, wherein a partial pressure of each background impurity within the internal volume of the reactor is below approximately $10^{-6}$ Torr.

Clause 56: a method of selectively adding precursor gas or vapor to an ultra-high purity background and controlling the partial pressure of said precursor gas or vapor, comprising: providing a reactor for atomic layer processing; providing at least one supplemental precursor gas or vapor delivery arrangement in communication with the reactor; establishing an ultra-high purity level within an internal volume of the reactor; selectively adding precursor gas or vapor into the internal volume of the reactor once the ultra-high purity level has been achieved; and controlling a background partial pressure of said precursor gas or vapor within the internal volume of the reactor.

Clause 57: an apparatus for supplying precursor gas or vapor to an ultra-high purity background and controlling the partial pressure of said precursor gas or vapor, comprising: a reactor having inner and outer surfaces; wherein at least a portion of the inner surfaces define an internal volume of the reactor, and wherein an ultra-high purity level is established within the internal volume of the reactor; a fixture assembly positioned within the internal volume of the reactor having a surface configured to hold a substrate within the internal volume of the reactor; at least one primary precursor gas or vapor delivery arrangement; and at least one supplemental precursor gas or vapor delivery arrangement.

Clause 58: the apparatus of clause 57, wherein the at least one primary precursor gas or vapor delivery arrangement is configured to sequentially supply the reactor with a precursor gas or vapor, and wherein the supplemental precursor gas or vapor delivery arrangement is configured to continuously supply the reactor with a precursor gas or vapor.

Clause 59: the apparatus of any of clauses 57-58, wherein the at least one supplemental precursor gas or vapor delivery arrangement comprises: a compressed gas cylinder or an ampoule in communication the reactor; and a reservoir and pressure gauge between the compressed gas cylinder or the ampoule and the reactor.

Clause 60: the apparatus of clause 59, wherein the at least one supplemental precursor gas or vapor delivery arrangement further comprises: a regulator between the compressed gas cylinder or the ampoule and the reservoir and pressure gauge; a first orifice between the regulator and the reservoir and pressure gauge; and a first valve between the first orifice and the reservoir and pressure gauge.

Clause 61: the apparatus of clause 60, wherein the at least one supplemental precursor gas or vapor delivery arrangement further comprises: a second orifice between the reservoir and pressure gauge and the reactor; and a second valve between the second orifice and the reactor; wherein the second orifice and the second valve control the flow of precursor gas or vapor from the reservoir to the reactor.

Clause 62: the apparatus of clause 60, further comprising system control software in communication with the pressure gauge and the first valve; wherein the system control software receives feedback from the pressure gauge and cycles the first valve based on the feedback to control flow into the reservoir.

Clause 63: the apparatus of clause 57, wherein the at least one supplemental precursor gas or vapor delivery arrangement comprises: a compressed gas cylinder or an ampoule in communication the reactor; wherein a regulator, an orifice, and a valve are provided between the compressed gas cylinder or ampoule and the reactor to control the flow of a precursor gas or vapor from the compressed gas cylinder or the ampoule to the reactor.

Clause 64: the apparatus of clause 57, wherein the at least one supplemental precursor vapor delivery arrangement further comprises: an ampoule in communication with the reactor; wherein an orifice and a valve are provided between the ampoule and the reactor to control the flow of precursor vapor from the ampoule to the reactor.

Clause 65: the apparatus of any of clauses 2-29, wherein a continuous, inactive gas flow is maintained from the process gas source to the ICP source and the reactor.

Clause 66: the apparatus of any of clauses 14-29, wherein a continuous, inactive gas flow is maintained from the at least one precursor vapor delivery arrangement to the reactor.

Clause 67: the method of any of clauses 31-55, further comprising maintaining a continuous, inactive gas flow from the process gas source to the ICP source and the reactor.

Clause 68: the method of any of clauses 43-55, further comprising maintaining a continuous, inactive gas flow from the at least one precursor vapor delivery arrangement to the reactor.

BRIEF DESCRIPTION OF THE DRAWINGS

FIG. 16 is a front view of a precursor/reactant vapor delivery arrangement according to another aspect of the present disclosure;

FIG. 17 is a front view of a precursor/reactant vapor delivery arrangement according to another aspect of the present disclosure;

FIG. 18 is a front view of a precursor/reactant vapor delivery arrangement according to another aspect of the present disclosure;

DESCRIPTION OF THE INVENTION

Figure 1:
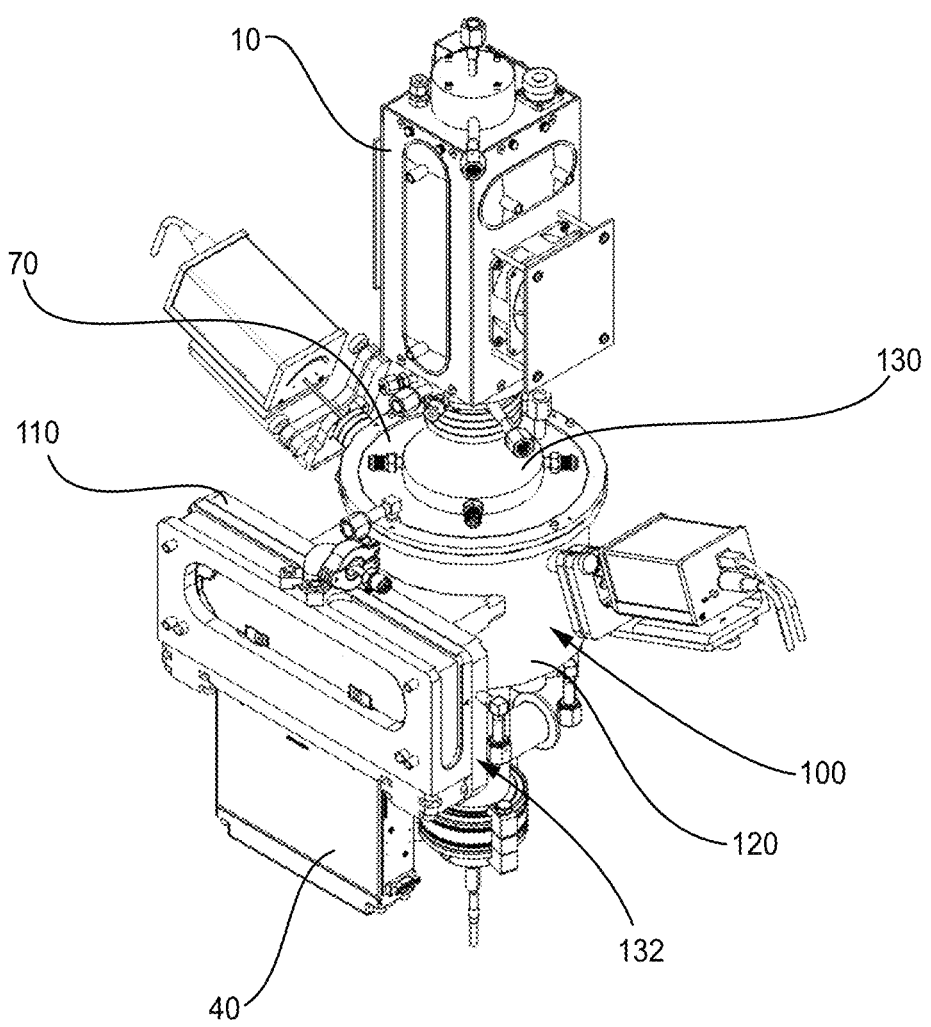
FIG. 1 is an isometric view of a reactor and additional components according to one aspect of the present invention.

For purposes of the description hereinafter, spatial orientation terms, as used, shall relate to the referenced embodiment as it is oriented in the accompanying drawings, figures, or otherwise described in the following detailed description. However, it is to be understood that the embodiments described hereinafter may assume many alternative variations and configurations. It is also to be understood that the specific components, devices, features, and operational sequences illustrated in the accompanying drawings, figures, or otherwise described herein are simply exemplary and should not be considered as limiting.

UHP conditions are based on reduced levels of background impurities to limit their role in surface reactions before, during and after film growth and/or etch by atomic scale processing techniques, such as limiting the incorporation of background oxygen impurities in nitride thin films by PEALD. UHP process conditions are also important in surface engineering where extremely tight control over the surface composition is paramount. For example, preparation of III-V element, as well as other non-silicon based, semiconductor channel materials (including 2D materials) for subsequent high-k gate oxide integration. Establishing UHP process conditions are also important for ALD/PEALD of elemental metals such as Ti, Al, Ta, and the like (versus more traditional metals such as ruthenium (Ru) and platinum (Pt) where growth is based on combustion chemistry), where, similar to nitrides, lowering oxygen content is extremely important. Since most transition and p-block metals tend to readily oxidize (even in the presence of very small amounts of oxygen), this presents some significant equipment design challenges that require careful consideration in order to reduce exposure to background impurities, such as oxygen species before, during and after film growth.

To establish a UHP process environment inside a reaction chamber for atomic scale processing, the partial pressure of background impurities must be reduced to less than $10^{-6}$ Torr (i.e., less than one Langmuir, or monolayer equivalent, exposure every second). Since water vapor is a very common and problematic background impurity for the growth of non-oxide based materials, it is used here to establish the upper limit (i.e., $10^{-6}$ Torr partial pressure) for defining UHP process conditions. To establish this requirement, it is instructive to first consider the specifications for a UHP grade (99.999% purity) process gas such as Ar and $N_2$. UHP grade $Ar/N_2$ contains oxygen impurities up to the ppm level. As discussed previously, these impurities include $O_2$, $H_2O$, CO and $CO_2$. For $Ar/N_2$ at 1 Torr pressure, the ppm level corresponds to $10^{-6}$ Torr partial pressure. For an impurity such as $H_2O$ at $10^{-6}$ Torr partial pressure, a growing nitride surface experiences 1 Langmuir $H_2O$ exposure every second (1 Langmuir=$10^{-6}$ Torr·s). Under these conditions, if each $H_2O$ molecule striking the surface adsorbs (or sticks), then ~1 monolayer surface coverage every second would be subsequently obtained. A typical PEALD process deposits less than a monolayer of material per each complete cycle (one complete cycle=one full sequence of precursor dose and purge steps). Typical PEALD cycle times range from approximately 10-60 seconds. Therefore, each sub-monolayer of material deposited experiences 10-60 Langmuir exposures (or 10-60 monolayer equivalent exposures) from water vapor at the $10^{-6}$ Torr level every second. To provide further insight into the relationship between background water vapor, and its incorporation during non-oxide based film growth, a kinetic adsorption model is presented below.

The surface flux F (molecules·$m^{-2}$·$s^{-1}$) for each gas/vapor phase component can be calculated using the Hertz-Knudsen equation: $F=P/(2\pi \cdot m \cdot k \cdot T_g)^{1/2}$ where P=partial pressure (Pa), m=mass (kg), k=Boltzmann constant ($1.381 \times 10^{-23}$ J/K) and $T_g$=gas/vapor temperature (K). The adsorption rate (molecules·$m^{-2}$·$s^{-1}$) is given by $dn_{ads}/dt=S \cdot F$ where S is the sticking probability ($0 \leq S \leq 1$). The sticking probability can be expressed as follows: $S=f(\theta) \cdot e^{-E/RTs}$ where $f(\theta)$ is a function of surface coverage $\theta$, E=activation energy for adsorption (kJ/mol), R=gas constant ($8.314 \times 10^{-3}$ kJ·$K^{-1}$·$mol^{-1}$) and $T_s$=surface/substrate temperature (K). For water vapor at $10^{-6}$ Torr=$1.33 \times 10^{-6}$ Pa partial pressure (1 Torr=133.32 Pa) and $T_g$=165° C.=438 K, the surface flux is $3.95 \times 10^{18}$ molecules/($m^2$·s)=$3.95 \times 10^{14}$ molecules/($cm^2$·s). For small surface area coverage (e.g., <20 at. %) assume the sticking probability is constant such that $S \cong e^{-E/RT}$. In this case, $n_{ads}=S \cdot F \cdot t$ where t is the time in seconds. The units for $n_{ads}$ are molecules/$cm^2$ (or atoms/$cm^2$ for $H_2O$ chemisorption). To represent a typical surface coverage during film growth by atomic scale processing, $TiN_x$ PEALD is utilized here as a model process. In particular, $TiN_x$ PEALD using $TiCl_4$ and a mixture of Ar—$N_2$—$H_2$ plasma at 350° C. substrate temperature (reactor temperature=165° C.) where each complete cycle deposits 0.33 Å=$3.3 \times 10^{-9}$ cm of material. The cycle time is 18 seconds for this particular process. The volume of material deposited during each cycle (on 1 $cm^2$ of surface area) is $3.3 \times 10^{-9}$ $cm^3$. Based on the bulk density of stoichiometric TiN (5.21 g/$cm^3$), the approximate mass of material deposited per cycle is $1.7 \times 10^{-8}$ grams. TiN atomic mass is 61.89 g/mol. Dividing mass by atomic mass, and multiplying by the Avogadro constant (N=$6.022 \times 10^{23}$ units/mol), yields $1.67 \times 10^{14}$ TiN units. Since each TiN unit consists of one Ti and one N atom, the number of Ti atoms $N_{Ti}$ equals the number of nitrogen atoms $N_N$ (i.e., $N_{Ti}=N_N=1.67 \times 10^{14}$ atoms). Therefore, each complete cycle deposits $N_{Ti} \cong 1.67 \times 10^{14}$ and $N_N \cong 1.67 \times 10^{14}$ atoms on 1 $cm^2$ of surface area during $TiN_x$ growth. Again, this is intended to represent a typical surface coverage during film growth by atomic scale processing. Moreover, a range of activation energies from 25 to 50 kJ/mol is used to represent different surface reactivities between $H_2O$ and generic surface species during film growth. In this case, let the time interval t equal the cycle time during $TiN_x$ PEALD (i.e., t=cycle time=18 seconds); therefore, $n_{ads}=(7.11 \times 10^{15}) \cdot e^{-E/RT}$ atoms/$cm^2$. At 350° C. (=623.15K) surface/substrate temperature, $n_{ads}$ varies between $5.71 \times 10^{13}$ to $4.58 \times 10^{11}$ atoms/$cm^2$ for activation energies ranging from 25 to 50 kJ/mol, respectively. Therefore, the number of oxygen atoms $N_{abs}$ adsorbed across 1 $cm^2$ surface area ranges from $N_{abs}=5.71 \times 10^{13}$ (25 kJ/mol) to $4.58 \times 10^{11}$ (50 kJ/mol). Combining this range of oxygen coverage ($N_{abs}$) with the number of Ti ($N_{Ti}$) and N ($N_N$) atoms determined above [i.e., oxygen at. %=$N_{abs}/(N_{abs}+N_{Ti}+N_N)$] provides an approximation of oxygen incorporation during film growth. For activation energies ranging from 25 to 50 kJ/mole, oxygen concentration ranges from ~15 to 0.1 at. %, respectively. The model shows that activation energies below ~35 kJ/mol are indicative of materials with a relatively high affinity for oxygen such that significantly lower $H_2O$ levels are necessary for low oxygen incorporation during growth. For activation energies exceeding 35 kJ/mol, oxygen content below ~2 at. % is predicted by the model which indicates $10^{-6}$ Torr partial pressure is sufficient for materials with sufficiently low reactivity with oxygen. On this basis, the upper limit of $10^{-6}$ Torr partial pressure for background impurities is established. For UHP process conditions inside a reaction chamber for atomic scale processing, the partial pressure of background impurities must be reduced to less than $10^{-6}$ Torr (i.e., less than one Langmuir, or monolayer equivalent, exposure every second).

According to one aspect, atomic scale processing, such as that performed by one of the aforementioned atomic scale processing techniques, may be configured to substantially eliminate background impurities from the permeation of elastomers, such as elastomeric o-rings used in atomic layer processing. For example, PEALD techniques commonly utilize ICP sources for plasma generation. In order to achieve vacuum integrity while maintaining reduced cost and serviceability of the unit, ICP sources require elastomeric seals on dielectrics used for signal transmission. By creating a sufficient vacuum on the atmosphere side of the elastomeric seal, or actively purging and/or backfilling this volume with a process gas of sufficient purity, atmospheric permeation of said elastomeric seals can be substantially eliminated, thus ensuring UHP process conditions.

In present atomic scale processing, ten connection points requiring sealing may be provided. Six connection points requiring sealing may be positioned above the plane of the substrate surface. Between this plane and a pump isolation valve, four additional connection points requiring sealing may be provided. These ten connection points are discussed in detail below.

With reference to FIG. 1, a reactor (100) may be provided. The reactor may include a chamber (120) where atomic scale processing may be performed. An ICP source (10) may be in communication with the reactor (100) and may be located above the reactor (100). Between the ICP source (10) and the reactor (100), a precursor input adaptor (130) may be provided and in communication with both the ICP source (10) and the reactor (100). A reactor lid (70) may be provided between the reactor (100) and the precursor input adapter (130). A transfer port (110) may be in communication with the reactor (100) and located at the front of the reactor (100). A gate valve (40) may be in communication with the transfer port (110) and is configured to isolate the reactor (100).

The permeation throughput is proportional to the difference in partial pressure, where the direction of flow is from high to low pressure. Therefore, by significantly reducing the partial pressure of oxygen species (e.g., $O_2$ and $H_2O$) on the atmosphere side, the permeation rate can be drastically reduced without sacrificing the practical benefits provided by elastomer seals. This may be accomplished by adding a second elastomeric o-ring seal and creating a volume in between the first and second elastomeric o-ring seals. A vacuum may then be applied within this volume such that the partial pressures of atmospheric components are substantially reduced. By adding the vacuum between the first elastomeric o-ring seal and the second elastomeric o-ring seal, the permeation rate can be lowered to achieve impurity levels below $10^{-6}$ Torr partial pressure in the reactor. An alternative method to reduce the atmospheric components is to actively purge and/or backfill this volume with a process gas of sufficient purity (e.g., using a UHP grade process gas such as $N_2$). For example, reducing the partial pressure of water for each of the ten fluoroelastomer o-rings in the existing configuration described above to 0.01 Torr would result in a partial pressure of approximately $4\times10^{-9}$ Torr for water (vs. ~$5\times10^{-6}$ Torr under atmospheric conditions) inside the reaction chamber due to permeation, well below the threshold of $10^{-6}$ Torr. These partial pressures are based on a fluoroelastomer o-ring temperature of 150° C., and an effective pumping speed $S_{eff}$=21 Liters/sec.

Figure 2A:
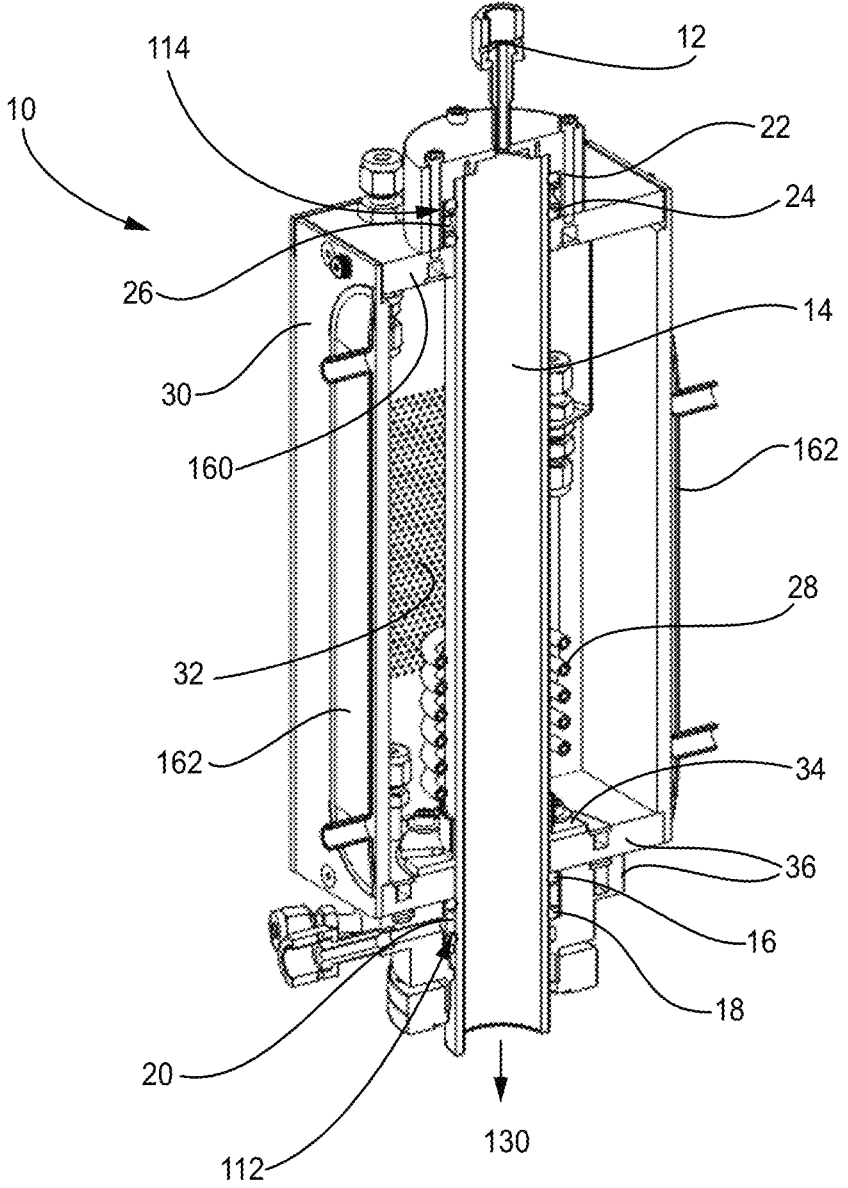
FIG. 2A is a cross-section of an inductively coupled plasma source for a reactor according to another aspect of the present disclosure.

With reference to FIG. 2A, an ICP source (10) cross-section is provided. As discussed above, six connection points requiring sealing may be positioned above the plane of the substrate surface. Two such connection points (112, 114) are provided in FIG. 2a. A reactor (100), such as a reactor for atomic scale processing, may be in communication with the ICP source (10), establishing a first connection point (112). At the first connection point (112) located at the bottom of a dielectric tube (14), a first elastomeric seal (16) and a second elastomeric seal (18) may be provided to maintain a sufficient seal between the connection of the ICP source (10) and the reactor (100). The first elastomeric seal (16) and the second elastomeric seal (18) may be in the form of an o-ring. The first elastomeric seal (16) and second elastomeric seal (18) may be spaced apart, such that a volume (20) is contained between the first elastomeric seal (16) and the second elastomeric seal (18). A vacuum may be applied to the volume (20) between the first elastomeric seal (16) and second elastomeric seal (18). The applied vacuum may reduce the partial pressure of atmospheric components, in particular the partial pressure of water vapor, therefore lowing the permeation rate to achieve impurity levels below $10^{-6}$ Torr partial pressure inside the reactor. Under these conditions, surfaces experience less than 1 Langmuir (or monolayer equivalent) exposure to background impurities every second, effectively reducing their role in surface reactions before, during and after film growth and/or etch by atomic scale processing techniques. This configuration of two elastomeric seals containing a volume therebetween with an applied vacuum to the volume may be referred to as a differentially pumped o-ring seal. An alternative method to reduce the atmospheric components is to actively purge and/or backfill volume (20) with a process gas of sufficient purity, such as UHP grade $N_2$. Actively purging and/or backfilling volume (20) may result in a positive pressure in volume (20). Actively purging and/or backfilling a volume contained between two elastomeric seals may also be referred to as a differentially pumped o-ring seal.

With continued reference to FIG. 2A, a process gas source (12) may be in direct communication with the ICP source (10), thereby allowing the process gas to flow into the dielectric tube (14) of the ICP source (10). A process gas can consist of an inactive gas and/or one or more precursor/plasma gases such as $O_2$, $N_2$, $H_2$, $NH_3$, and the like. Therefore, the process gas source (12) also includes one or more MFCs for controlling gas flow, located upstream from ICP source (10), which provides continuous, viscous-laminar inactive gas flow, and/or continuous or sequential precursor/plasma gas flow through the ICP source (10) to the reactor (100) (see FIG. 26). While within the ICP source (10), the process gas is contained within the dielectric tube (14). At the top of the dielectric tube (14), at a second connection point (114) that is between the ICP source (10) and a process gas source (12), a third elastomeric seal (22) and fourth elastomeric seal (24) may be provided. The third elastomeric seal (22) and fourth elastomeric seal (24) may be a differentially pumped o-ring seal, therefore being substantially the same as the configuration of the first elastomeric seal (16) and the second elastomeric seal (18), where a volume (26) is also contained between the third elastomeric seal (22) and the fourth elastomeric seal (24) and a vacuum applied to the contained volume (26) to reduce the partial pressure of the atmospheric components. An alternative method to reduce the atmospheric components is to actively purge and/or backfill volume (26) with a process gas of sufficient purity, such as UHP grade $N_2$. Actively purging and/or backfilling volume (26) may result in a positive pressure in volume (26).

With continued reference to FIG. 2A, the ICP source (10) includes an inductor coil (28) around the dielectric tube (14). The inductor coil (28) is used to generate plasma by coupling an applied electromagnetic field to the process gas inside the dielectric tube (14). A metallic Faraday enclosure (30) is provided around the inductor coil (28) and dielectric tube (14) to shield RF radiation produced by the inductor coil (28), as well as radiation emitted by plasma species generated inside the dielectric tube (14). At one of the various surfaces of the enclosure (30), a forced air outlet grill (32) may be provided. The forced air outlet grill (32) may enable the air flow produced by a cooling fan (see 150 of FIG. 2B) positioned on one of the various surfaces of the enclosure (30).

Figures 2B, 2C:
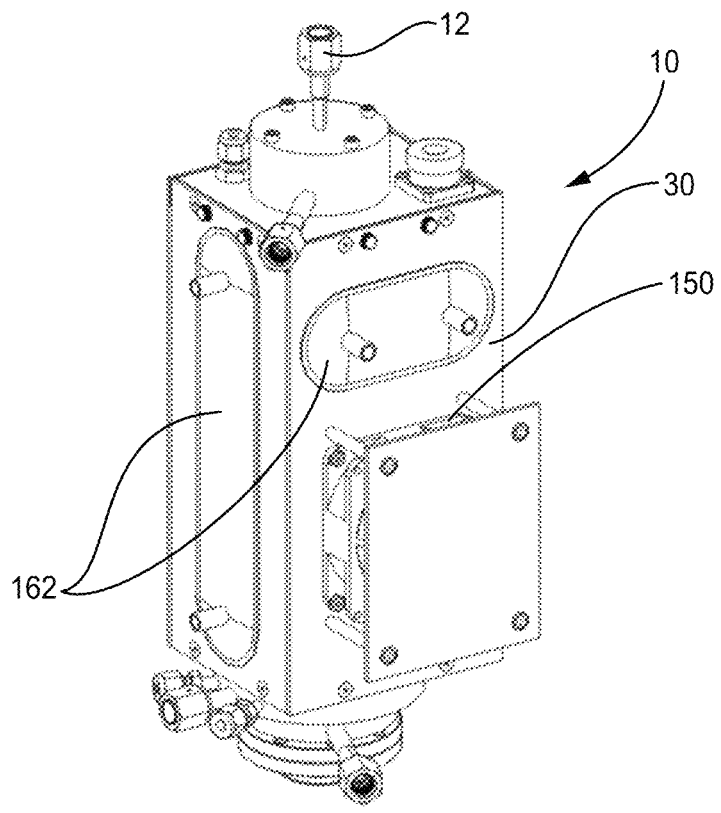
FIG. 2B is an isometric view of the back of an inductively coupled plasma source for a reactor according to another aspect of the present invention.
FIG. 2C is a cross section of a water cooled adapter for an inductively coupled plasma source according to another aspect of the present disclosure.

The ICP source (10) may include a cooling arrangement. The cooling arrangement may include the cooling fan (150) of FIG. 2B. The cooling arrangement may include a heat sink (34) within the enclosure (30). The heat sink (34) may be provided around the circumference of the dielectric tube (14). The cooling arrangement may include a water-cooled base plate and mounting flange (36). The cooling arrangement may include a water-cooled base plate (160) located below the second connection point (114). With reference to both FIGS. 2A and 2B, the cooling arrangement may include at least one water cooled enclosure panel (162) located on one or more of the surfaces of the enclosure (30). For example, a water cooled enclosure panel (162) may be provided on at least two surfaces of the enclosure (30), such as at least three surfaces of the enclosure (30), as shown in FIGS. 2A and 2B. The cooling fan (150), heat sink (34), water-cooled enclosure panels (162), water-cooled base plate (160), as well as the water-cooled base plate and mounting flange (36) may be provided to manage the heat load on the dielectric tube (14), inductor coil (28) and enclosure (30). In particular, the heat sink (34) and water-cooled base plate and mounting flange (36) prevent thermal damage to the elastomeric seals on dielectric tube (14) sealing surfaces. With reference to FIG. 2C, for additional heat load management, the cooling arrangement may include a water cooled adapter (164) below the process gas source (12) at the second connection point (114). Effective management of the heat load is especially important for high power ICP source operation; for example, high power operation up to 3 kW. For example, elastomeric seals provided at the first connection point (112) and the second connection point (114) should not exceed a temperature of 300° C., such as not exceed a temperature of 200° C., such as not exceed a temperature of 150° C. Thus, the cooling arrangement, including any of the aforementioned cooling arrangement components, may be configured to keep the temperature of the elastomer seals at the first connection point (112) and/or at the second connection point (114) below 300° C., such as below 200° C., such as below 150° C. The ICP source (10) may be in communication with the reactor (100). A precursor input adapter (130) may be provided between the ICP source (10) and the reactor (100)

Figure 3:
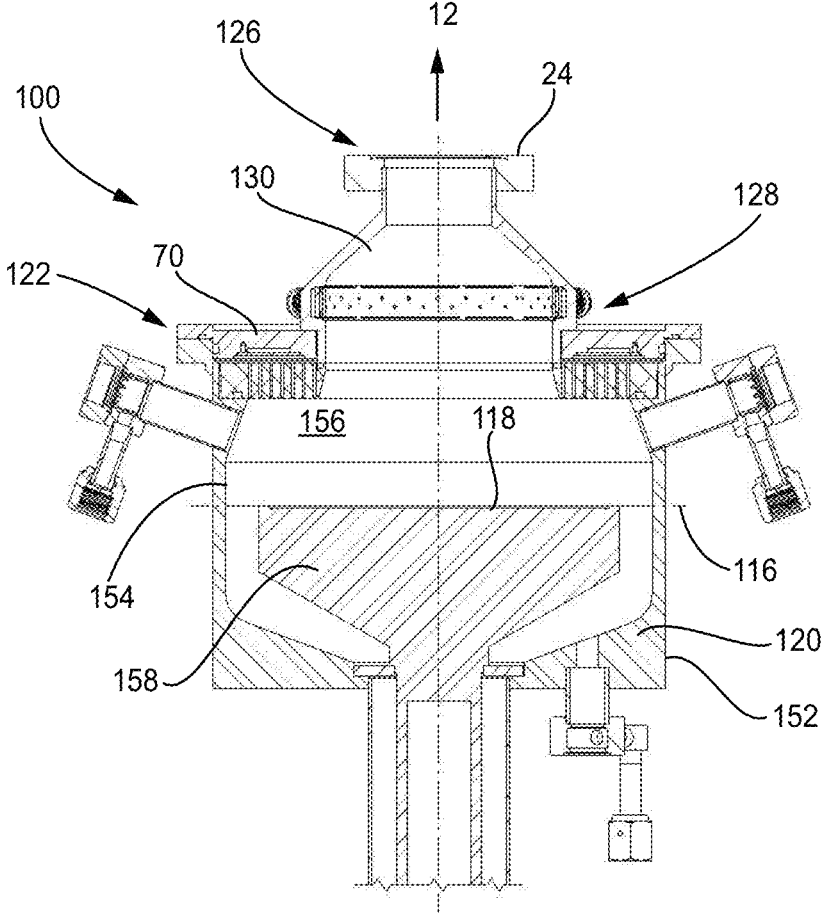
FIG. 3 is a cross-section of a reactor according to another aspect of the present disclosure.

In addition to the two dielectric tube connections (i.e., the first connection point (112) and second connection point (114)), the differentially pumped o-ring seal configuration may also be incorporated into other connection points of the present invention. As discussed above, six connection points requiring sealing may be positioned above the plane of the substrate surface. Three such connection points (122, 126, 128) are shown in FIG. 3. With reference to FIG. 3, a differentially pump o-ring seal configuration as defined herein may be incorporated at a third connection point (122) between a reactor lid (70) and the chamber (120) of the reactor (100). At a fourth connection point (126) between the ICP source (10) and a plasma port (124), which connects the ICP source (10) to the precursor input adapter (130), a metal seal connection may be implemented. Further, at a fifth connection point (128) between the precursor input adapter (130) and the reactor lid (70), the precursor input adapter (130) and the reactor lid (70) may be welded together. The reactor (100) may comprise outer surfaces (152) and inner surfaces (154). The inner surfaces (154) of reactor (100) above the plane (116) of the substrate (118) define an internal volume (156) of the reactor (100). A fixture assembly (158) may be within the internal volume (156). The fixture assembly (158) may have a surface configured to hold the substrate (118) within the internal volume (156) of the reactor (100).

With reference back to FIG. 1, at the last connection point above the plane (116) of the substrate (118), at a sixth connection point (132) between the gate valve (40) and the transfer port (110), a differentially pump o-ring seal may be implemented, which is further discussed below regarding FIG. 5. Thus, all connection points above the plane (116) of the substrate (118) comprise either differentially pumped o-ring seals, metal seals, or are welded together. The differentially pumped o-ring seals at the third connection point (122) and the sixth connection point (132) may comprise a vacuum in the volume between the two elastomeric seals, or alternatively, the volume between the two elastomeric seals may be actively purged or backfilled with a process gas of sufficient purity, such as UHP grade $N_2$.

In the present arrangement of elastomeric seals, four o-rings are positioned above the plane (116) defined by the substrate (118) which are all differentially pumped. For a fluoroelastomer seal temperature of 150° C. and an effective pumping speed $S_{eff}$=21 Liters/sec, if the partial pressure of water is reduced to 0.01 Torr, the impurity level of water within the internal volume (156) of the reactor (100) may be reduced to approximately $2 \times 10^{-9}$ Torr partial pressure which is well below the specification for UHP conditions. This corresponds to 1 Langmuir (or monolayer equivalent) water exposure every 500 seconds. In contrast, the water impurity level without differential pumping is approximately $3 \times 10^{-6}$ Torr which is 3× greater than the requirement for UHP reactor conditions.

All downstream elastomeric o-ring connections, positioned below the plane (116) of the substrate (118), can be maintained without differential pumping, or active purging and/or backfilling with a process gas. These downstream elastomeric seals can be maintained since a sufficient diffusion barrier is provided by the continuous, viscous-laminar flow of process gas which prevents any back-diffusion of impurities into internal volume (156) of reactor (100). This gas flow is provided, in part, by process gas source (12). Maintaining these elastomer seals keeps the design of reactor (100) simple which reduces cost and improves serviceability.

Figure 4:
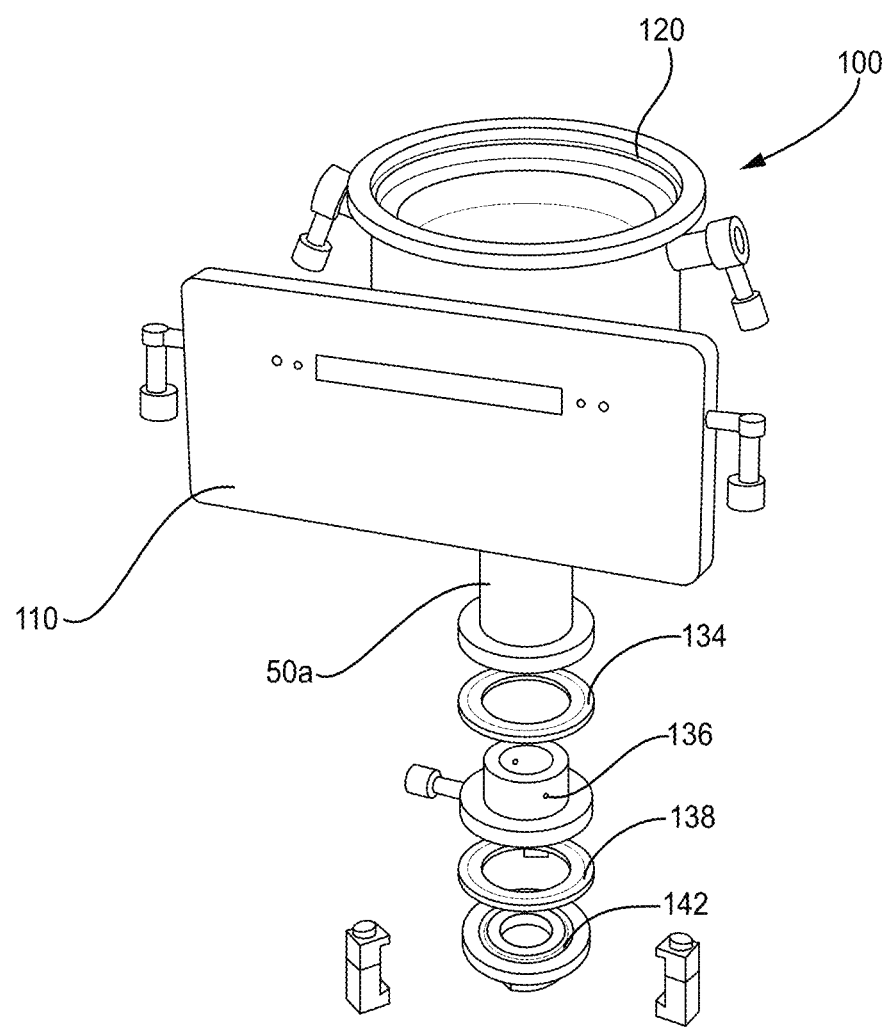
FIG. 4 is an isometric view of a reactor and additional components located below the reactor according to another aspect of the present disclosure.

As discussed above, four connection points are located between the plane (116) of the substrate (118) and a pump isolation valve. Three of said connection points (134, 138, 142) are shown in FIG. 4. With reference to FIG. 4, at a seventh connection point (134) between an exhaust port (50a) and an exhaust port purge adapter (136), an elastomeric o-ring seal may be provided. This elastomeric o-ring seal at the seventh connection point (134) can be maintained without differentially pumping. Below the exhaust port purge adapter (136), an eighth connection point (138) is provided that includes an elastomeric o-ring seal that does not have to be differentially pumped. Further below the exhaust port purge adapter (136) and above a heater stem (146; see FIG. 6) is a ninth connection point (142) that includes an elastomeric o-ring seal that does not have to be differentially pumped.

Figure 5:
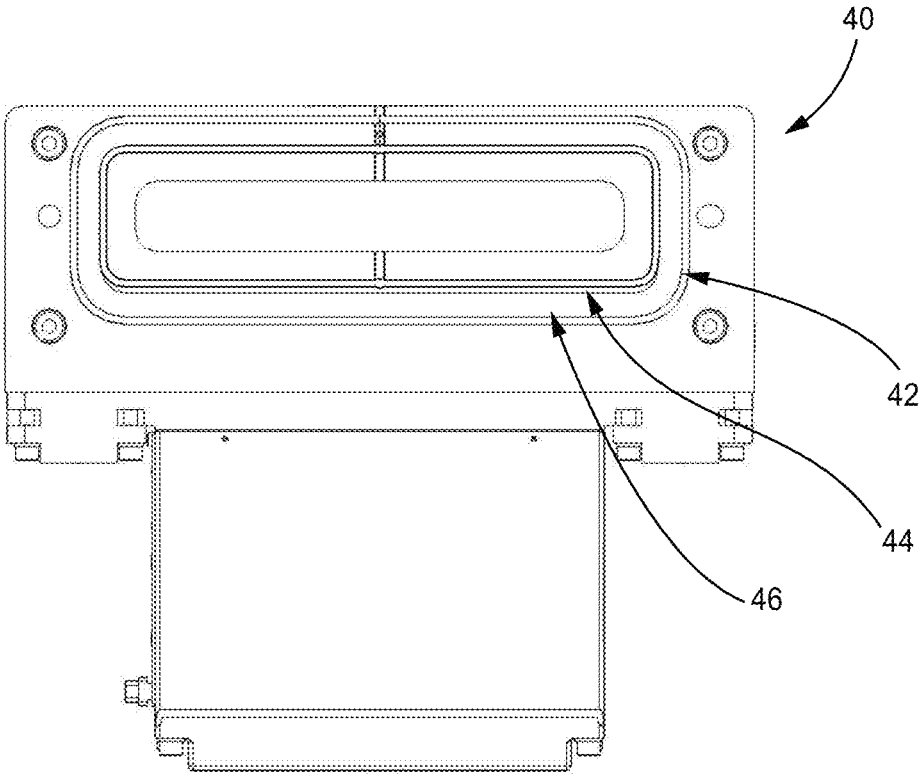
FIG. 5 is a front view of a gate valve according to another aspect of the present disclosure.

With reference to FIG. 5, a gate valve (40) is provided. FIG. 5 is a non-limiting example of a gate valve (40) that may aid in the elimination of background impurities from elastomeric permeation by implementing a differentially pumped o-ring seal. The gate valve (40) may include a first elastomeric seal (42) and a second elastomeric seal (44). A volume (46) may be provided between the first elastomeric seal (42) and the second elastomeric seal (44), and a vacuum may be applied to the volume (46) in order to reduce the atmospheric partial pressure, thereby reducing the level of background impurities that permeate through the elastomeric materials. Alternatively, the volume between the two elastomeric seals may be actively purged or backfilled with a process gas of sufficient purity, such as UHP grade $N_2$. The gate valve (40) may be implemented at the transfer port (110) of the chamber (120), as shown in FIG. 1. The transfer port (110) may enable substrate transfer for a variety of configurations including cluster tool arrangements enabling multi-technique capabilities. The gate valve (40) provides reactor isolation upon completion of substrate transfer.

According to another aspect, atomic scale processing, such as that performed by one of the aforementioned atomic scale processing techniques, may substantially eliminate background impurities from process pump back-diffusion and back-streaming. Downstream process pump impurities may be prevented from entering the reaction zone where the substrate is located by maintaining continuous, viscous-laminar gas flow during normal operation to create a diffusion barrier. This gas flow is provided, in part, by process gas source (12).

Figure 6:
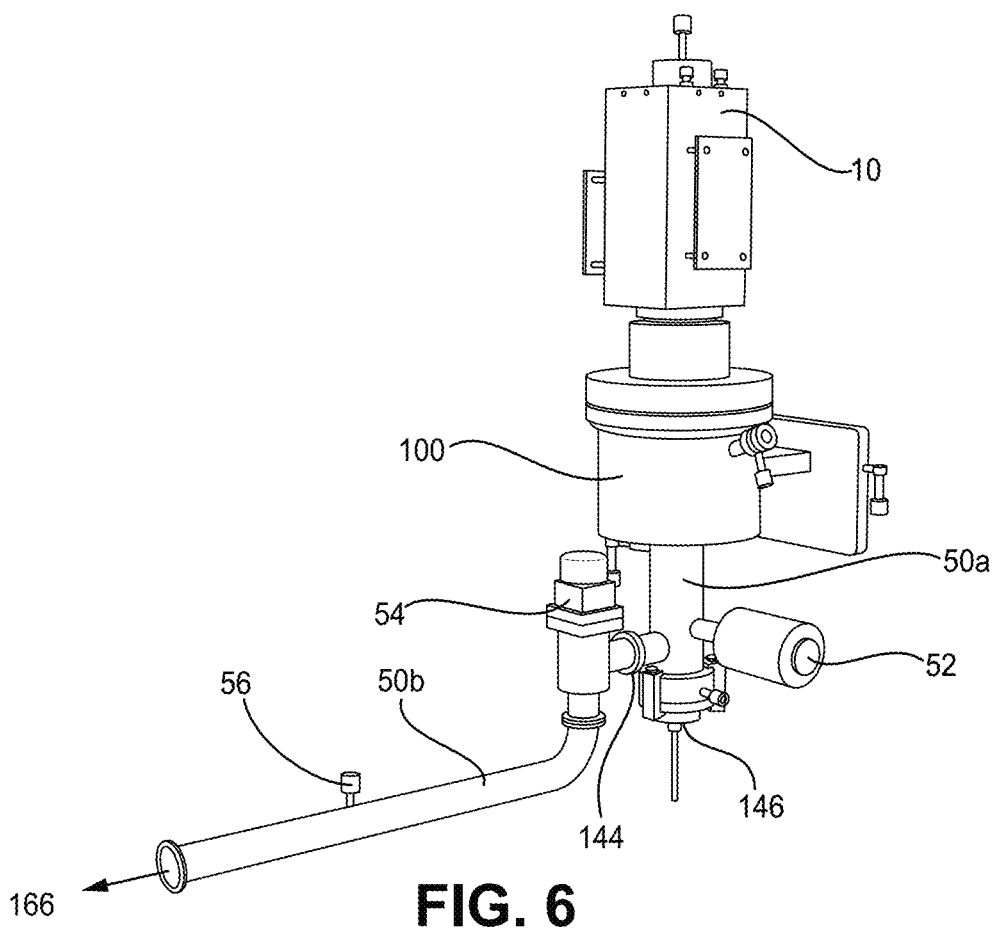
FIG. 6 is a front view of additional components located below a reactor according to another aspect of the present disclosure.

The final connection point (144) located between the plane (116) of the substrate (118) and the pump isolation valve (54) is shown in FIG. 6. With reference to FIG. 6, an exhaust port (50a) may be in communication with the reactor (100) and a pump isolation valve (54). At a tenth connection point (144) between the exhaust port (50a) and the pump isolation valve (54), an elastomeric o-ring seal (58) may be provided that does not need differentially pumped. A pressure gauge (52) may be attached to and in communication with the exhaust port (50a) leading from the reactor (100). The pressure gauge (52) may be used to determine the pressure in the reactor (100) without introducing dead-space volume inside the reactor (100). A pump isolation valve (54) may be attached to a portion of the exhaust port (50a) and a portion of a foreline (50b). The pump isolation valve (54) may be opened or closed in order to isolate a pump (166) from the reactor (100). The foreline (50b) may run from the pump isolation valve (54) to the pump (166). The pump (166) may be any suitable chemical series pump that enables the flow of process gases, over the required range of pressures and gas flow rates, through the reactor (100), exhaust port (50a), and foreline (50b) such that continuous, viscous-laminar flow is maintained. For example, a chemical series mechanical pump with pumping speed ranging from approximately 5-50 Liters/sec. Parallel pumping channels (e.g., pumping channels A and B) may also be utilized. For example, channel A may be a chemical series mechanical pump for operation at pressures above approximately 200-300 mTorr, and channel B may be a chemical series turbomolecular pump for operation at lower pressures (e.g., 1-100 mTorr). A downstream port (56) may be attached to and in communication with the foreline (50b). The downstream port (56) provides purge and vent protection to reduce the potential for pump back-diffusion and back-streaming of impurities (see FIG. 27 and the corresponding description below). For example, the downstream port (56) may be configured to provide continuous, viscous-laminar gas flow (using a MFC, orifice, or some other suitable means of controlling gas flow) when the reactor (100) is not in communication with the pump (166). Therefore, pump (166) can remain on when the pump isolation valve (54) is closed without the risk of introducing impurities into the foreline (50b) from the pump (166). When the pump (166) is turned off for maintenance purposes, power loss, pump failure, and/or the like, the pump isolation valve (54) may be used to isolate the reactor (100) while the downstream port (56) may be configured to provide gas flow that rapidly brings the foreline (50b) up to atmospheric pressure to avoid back-streaming of impurities from the pump (166) into the foreline (50b). For example, tubing from an inactive gas source (e.g., $N_2$) at positive pressure to a valve, and from the valve to downstream port (56) which enables rapid venting of the foreline (50b) to atmospheric pressure when the pump isolation valve (54) is closed and the pump (166) is off.

Figure 7:
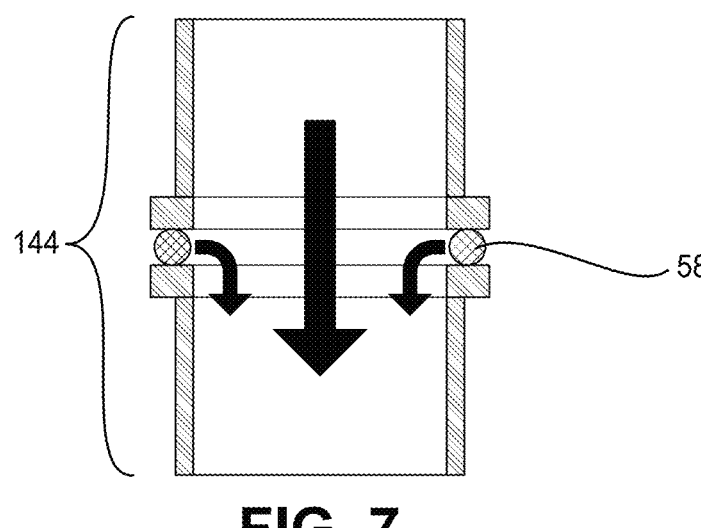
FIG. 7 is a cross-section of a tenth connection point according to another aspect of the present disclosure.

As mentioned previously, the diffusion barrier created by continuous, viscous-laminar gas flow also prevents downstream impurities due to elastomer permeation from back-diffusing and entering the internal volume (156) of the reactor (100). Therefore, maintaining continuous, viscous-laminar flow enables the use of elastomer seals downstream while still maintain a UHP process environment. With reference to FIG. 7, the tenth connection point (144) is shown between the exhaust port (50a) and the pump isolation valve (54). At the tenth connection point (144), an elastomeric o-ring seal (58) is provided. A continuous, viscous-laminar gas flow through the reactor (100), the exhaust port (50a), and the pump isolation valve (58) creates a diffusion barrier which prevents impurities from back-diffusing and entering the internal volume (156) of the reactor (100).

Figure 8:
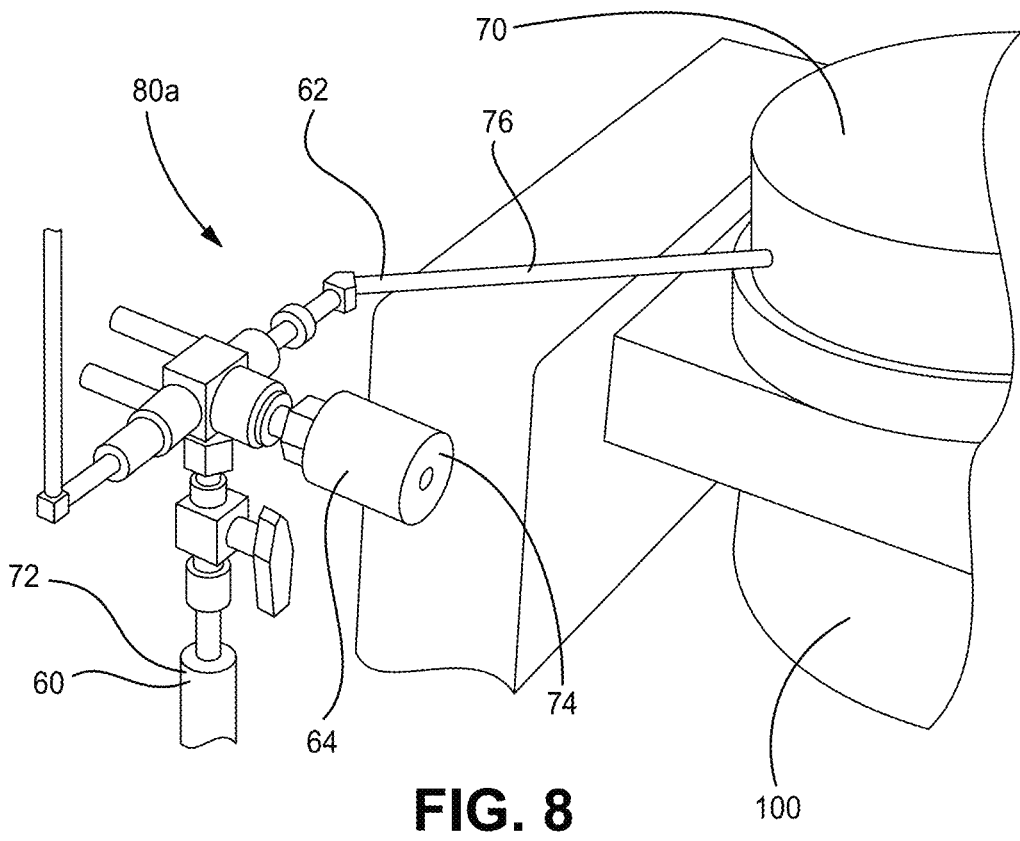
FIG. 8 is a front view of a precursor/reactant vapor delivery arrangement to a reactor according to another aspect of the present disclosure.

According to another aspect, atomic scale processing, such as that performed by one of the aforementioned atomic scale processing techniques, may substantially eliminate background impurities from outgassing and vaporization. FIG. 8 depicts a precursor (or reactant) vapor delivery arrangement (80a) for delivering a precursor vapor to the reactor (100). One or more precursor vapor delivery arrangements (80a) may be in communication with the reactor (100). The delivery components may include an ampoule (60) that includes a precursor for atomic scale processing. A line to the reactor (62) may be in communication with the ampoule (60) and reactor (100) such that the precursor may be transported to the reactor (100). The valving (64) may be attached to and in communication with the line to reactor (62). The valving (64) may be opened or closed to control the introduction of precursor vapor from the ampoule (60) into the line to the reactor (62). The precursor vapor delivery arrangement (80a) also includes a MFC, located upstream from valving (64), which provides continuous, viscous-laminar inactive gas flow through valving (64) and line to the reactor (62) for effective vapor delivery and subsequent purging of the delivery components (see FIG. 26). The combination of continuous, inactive gas flow from the one or more said precursor vapor delivery arrangements (80a), as well as process gas source (12) provides a continuous, viscous laminar flow through the reactor (100), exhaust port (50a) and foreline (50b) to pump (166).

Figure 9:
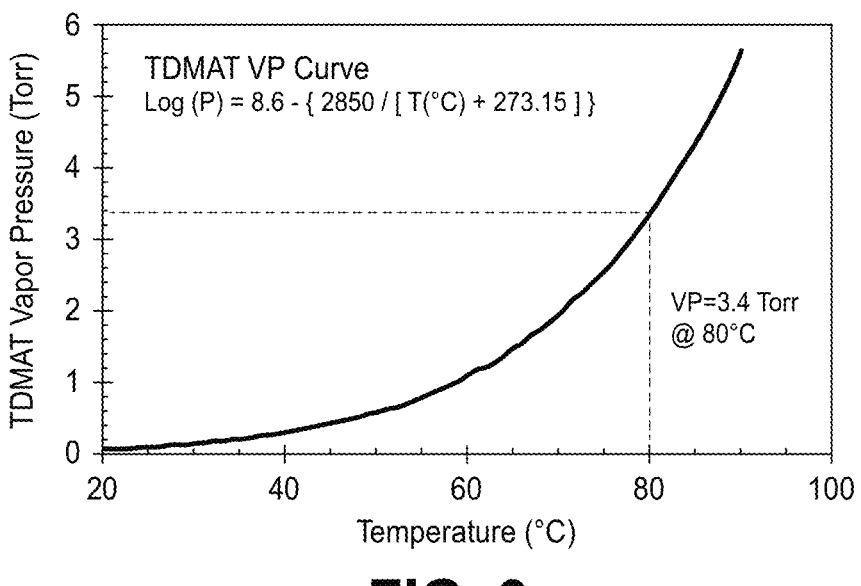
FIG. 9 is a graph of temperature vs. vapor pressure for tetrakis-dimethylamino titanium (TDMAT)

Thermal management (or temperature uniformity and control) is essential for creating and maintaining a UHP process environment. In addition to continuous, viscous-laminar flow of inactive carrier/purge gas (e.g., Ar or $N_2$), heating of delivery source components is required to prevent long residence times due to precursor adsorption, as well as condensation or deposition within the delivery channel. In many cases, effective vapor delivery also requires heating of the liquid/solid phase precursor itself to increase its vapor pressure. With reference to FIG. 9, a graph of the influence temperature has on the vapor pressure of tetrakis-dimethyl-amino titanium (TDMAT) is provided. TDMAT is a liquid phase precursor that is commonly used for ALD/PEALD of $TiO_2$ and $TiN_x$. The temperature of all the associated delivery source components must be sufficiently high and uniform to minimize the residence of the precursor vapor (e.g., TDMAT, $H_2O$, etc.) within the delivery channel.

Figure 10:
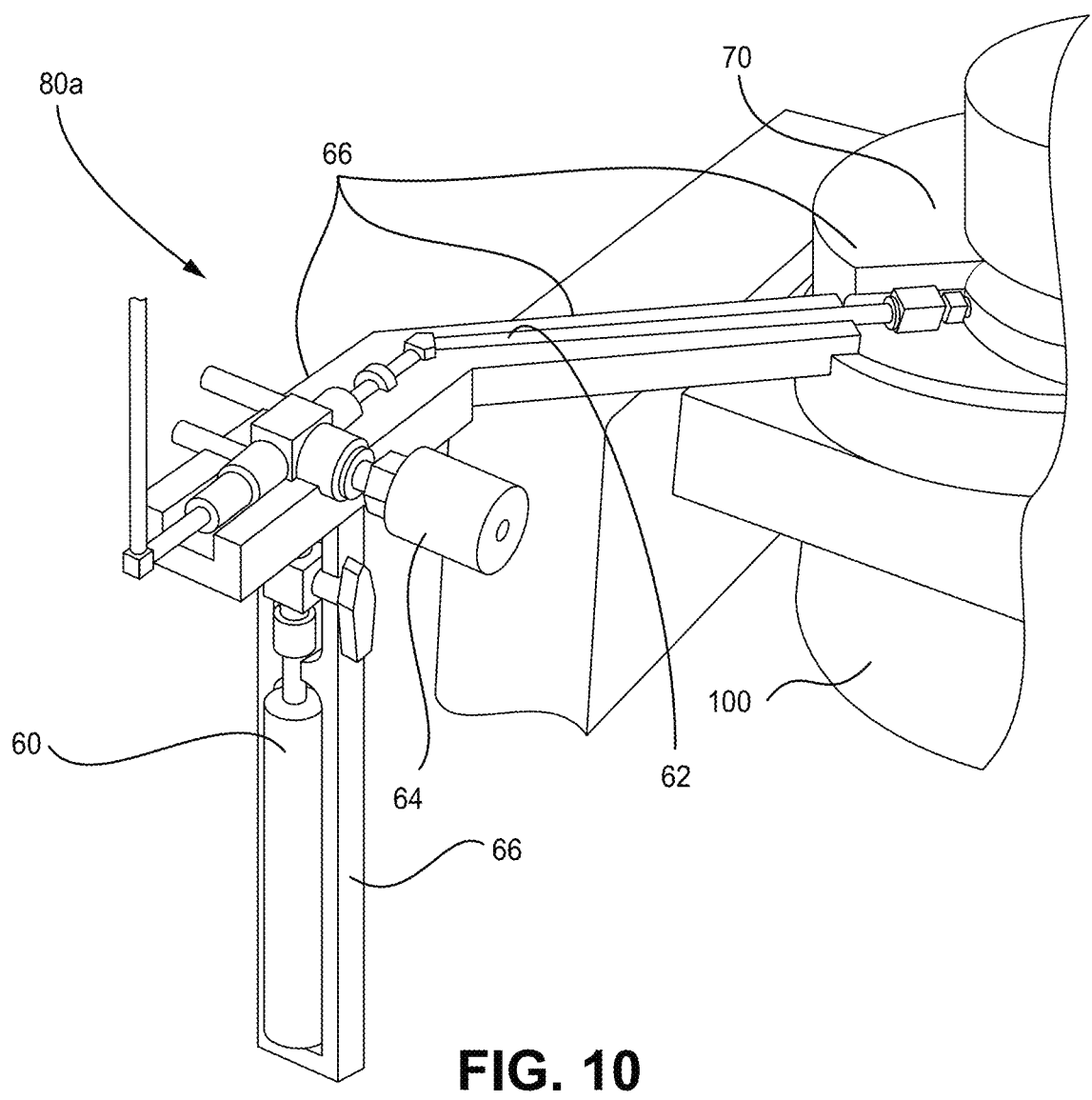
FIG. 10 is a front view of a precursor/reactant vapor delivery arrangement to a reactor according to another aspect of the present disclosure.

With reference to FIG. 10, in order to effectively maintain temperature uniformity, cladding (66) may be added to the precursor vapor delivery arrangement (80a) around the ampoule (60), valving (64), and/or at least a portion of the line to reactor (62) and/or to the reactor (100) around the reactor lid (70) for effective temperature management. The cladding (66) may be a metallic material. For example, the cladding (66) may be aluminum (Al) cladding. Aluminum (Al) cladding may be added to the ampoule (60), valving (64), and certain surfaces of the line to the reactor (62) and/or the reactor lid (70) to aid in the management of the temperature. Alternatively, or in addition to the aluminum cladding, the cladding (66) may comprise some other suitable thermal mass with sufficient thermal conductivity to control the temperature of the components where the cladding (66) is present. For example, different metallic material may be used for the cladding (66), such as copper (Cu), in addition or alternatively to aluminum. The cladding (66) may be in the form of a solid structure that wraps at least partially around the ampoule (60), valving (64), the line to the reactor (62), and/or the reactor lid (70). Alternatively, the cladding (66) may take a different form. For example, the cladding (66) may be in the form of beads that cover at least a portion of the surfaces of the ampoule (60), valving (64), the line to the reactor (62), and/or the reactor lid (70).

Figure 11:
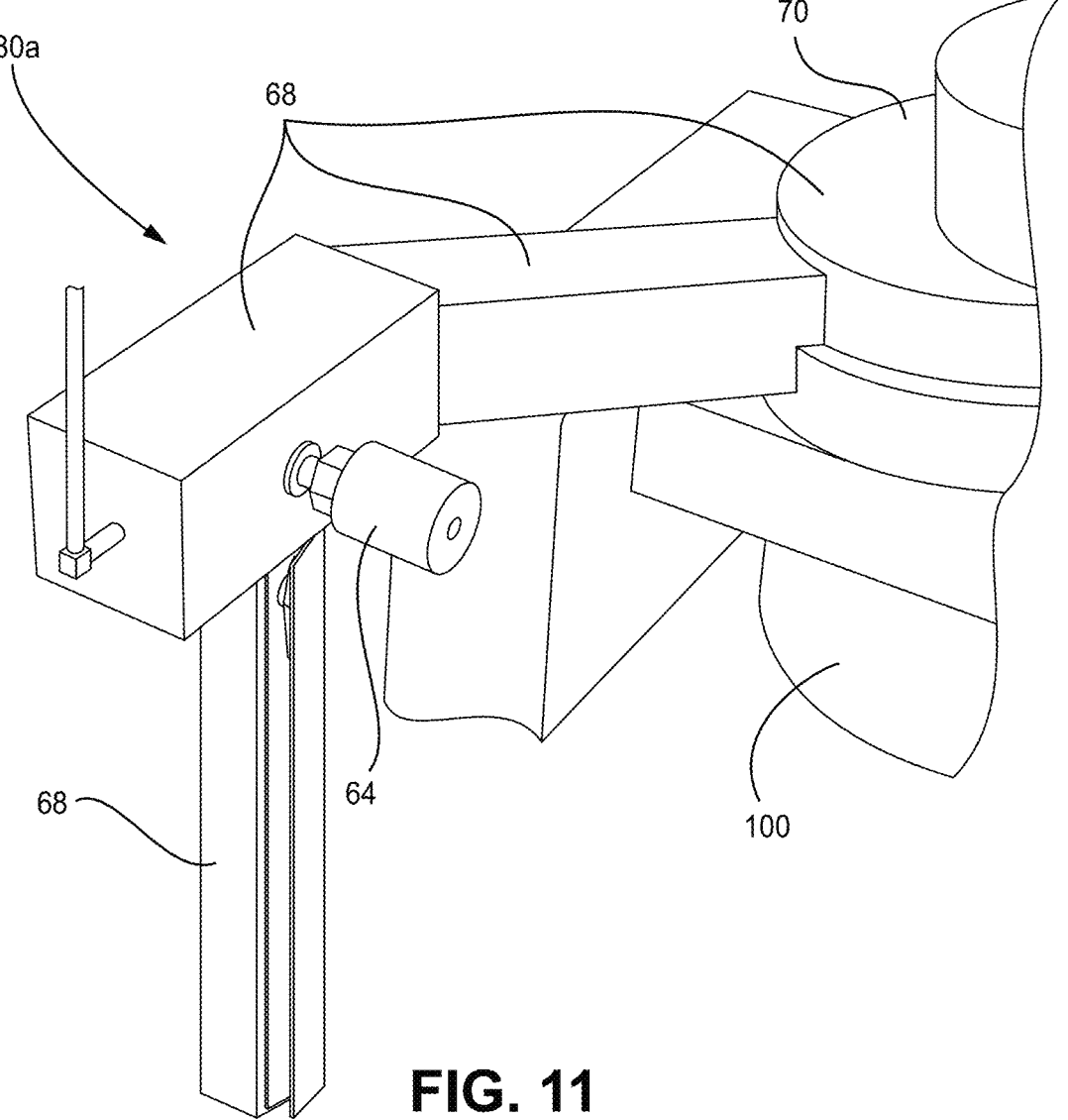
FIG. 11 is a front view of a precursor/reactant vapor delivery arrangement to a reactor according to another aspect of the present disclosure.

With reference to FIG. 11, in addition to or as an alternative to the cladding (66), a heater jacket (68), or some other suitable means of supplying thermal energy, may be added to the precursor vapor delivery arrangement (80a) around the ampoule (60), valving (64), and/or at least a portion of the line to the reactor (62) and/or to the reactor (100) around at least a portion of the reactor lid (70) to aid in temperature management. In some non-limiting embodiments, the jacket (68) may be added around the entire circumference of the line to the reactor (62) and/or reactor lid (70). Even across complicated geometries, including reactor components, ampoules, valving and lines to the reactor, cladding (66) and jackets (68), along with multiple independently controlled heat zones, enable a temperature non-uniformity below ±5%. Software controls may be used to control temperature within ±0.5° C. of the setpoint.

Figure 12:
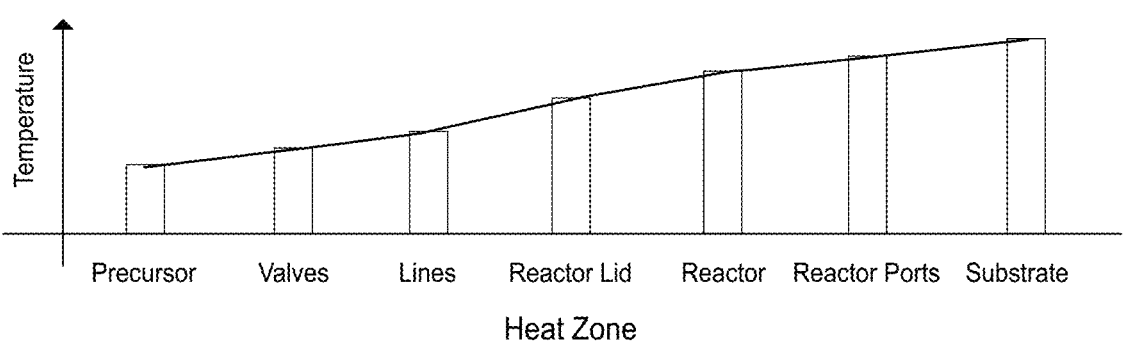
FIG. 12 is a graph of the temperature change across multiple independently controlled heat zones of a reactor according to another aspect of the present disclosure.

As previously stated, the reactor system may include multiple independently controlled heat zones, as shown in FIG. 12. For example, as shown in FIG. 8, the reactor system may include a first independently controlled heat zone (72) to include the ampoule (60). The reactor system may include a second independently controlled heat zone (74) to include the valving (64). The reactor system may include a third independently controlled heat zone (76) on the line to the reactor (62). It is respectfully noted, that the reactor system may include various additional independently controlled heat zones, and is not limited to the three aforementioned independently controlled heat zones. For example, the reactor (100) may include an independently controlled heat zone on the reactor lid (70). The reactor (100) may include an independently controlled heat zone on the reactor sidewalls. The reactor (100) may include an independently controlled heat zone at one or more reactor ports. The reactor (100) may include an independently controlled heat zone at the fixture assembly (158). A reactor system with multiple independently controlled heat zones aids in sustaining temperature uniformity and also provides the ability to create a temperature gradient. For example, various independently controlled heat zones may be used to control and increase temperature from the precursor ampoule to the substrate as illustrated in FIG. 12. The various independently controlled heat zones enable the temperature gradient of FIG. 12 such that precursor residence times are reduced.

Outgassing may also occur from non-heated system components. For example, surface outgassing of water from stainless-steel tubing to the reactor due to atmosphere exposure. It is, therefore, necessary to have procedures in place to ensure sufficient outgassing of these non-heated components. Outgassing can also be stimulated by alternative energy sources such as plasma. As such, pre-conditioning with plasma may be performed prior to atomic scale processing under UHP conditions.

Outgassing may further occur through diffusion and subsequent desorption of absorbed elements or compounds within the reactor walls and internal fixtures. For example, outgassing of water, including volatile plasticizers and stabilizers associated with the manufacturing process, from elastomer seals. In order to address this form of outgassing, any of the aforementioned elastomeric seals (e.g., elastomeric o-rings) may be pre-annealed. After installation of the pre-annealed elastomeric seals, said seals may be baked once again to remove water and other impurities subsequently absorbed due to atmosphere exposure.

Figure 13:
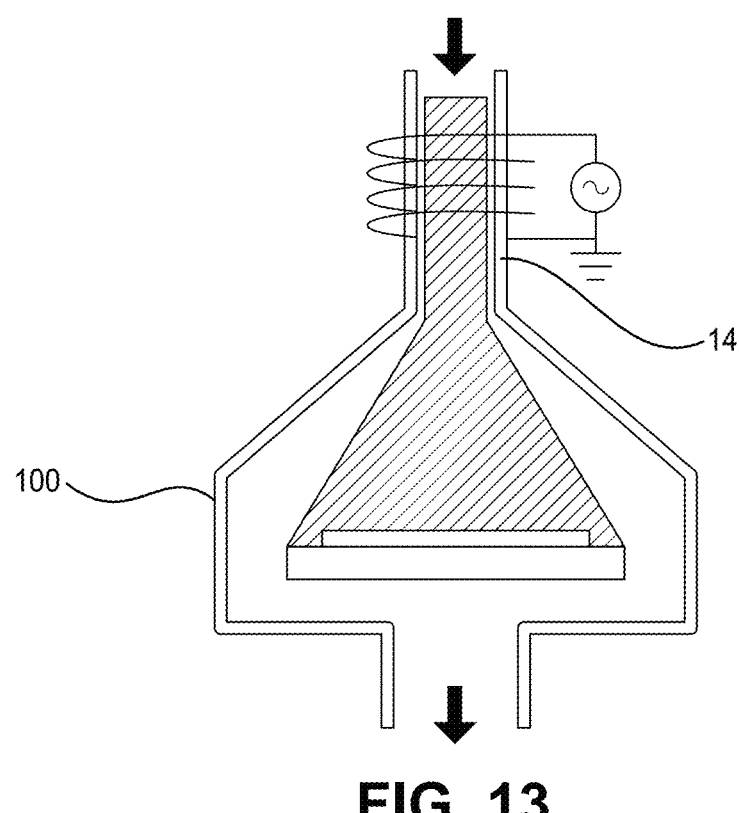
FIG. 13 is a front view of a reactor for atomic scale processing according to another aspect of the present disclosure.
Figures 14, 15:
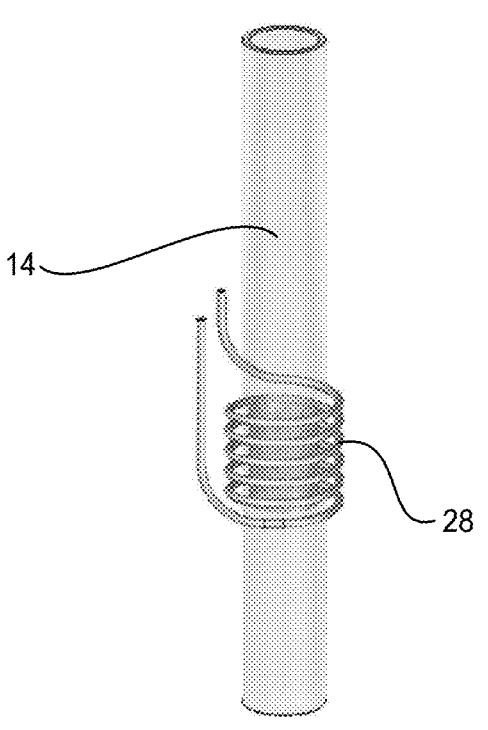
FIG. 14 is a front view of a dielectric tube according to another aspect of the present disclosure.
FIG. 15 is an image of the plasma density of a plasma sheath on a reactor surface according to another aspect of the present disclosure.

According to another aspect, atomic scale processing, such as that performed by one of the aforementioned atomic scale processing techniques, may substantially eliminate background impurities from plasma etching. With reference to FIG. 13, the dielectric tube (14) is in communication with the reactor (100). The dielectric tube (14) commonly includes fused silica (or quartz). However, plasma etching may result from the use of a fused silica/quartz dielectric tube, as is shown in FIG. 14. As shown in FIG. 14, the discolored area of the dielectric tube (14) where the inductor coil (28) is located is due to plasma etching on the inner surfaces of the dielectric tube (14). In order to prevent chemical etching, or physical/sputter etching due to direct plasma exposure of the fused silica surface, the dielectric tube (14) may include an additional and/or alternative material. For example, ceramic alumina, sapphire or alumina coated fused silica, may be used in order to prevent etching of the dielectric tube (14) surface. Such plasma etching can be eliminated, or significantly reduced, by use of ceramic alumina, sapphire or alumina coated fused silica to obtain a sufficient UHP process environment.

A further consideration is chemical and/or physical etching of reactor (100) surfaces located downstream from the plasma generation region. Physical/sputter etching occurs when ions are accelerated across a plasma sheath formed on surfaces directly exposed to plasma. To minimize such chemical and physical etching on reactor (100) sidewall surfaces, said surfaces can be passivated with a material such as alumina and pretreated with plasma prior to UHP processing.

With reference to FIG. 15, a plasma sheath (102) on an exposed surface (104) is illustrated. The plasma sheath (102) develops to balance the flow of positive and negative charge to surfaces directly exposed to plasma (106) such as the dielectric tube (14) and downstream reactor (100) surfaces. The y-axis in FIG. 15 corresponds to plasma density where the imbalance between ion charge ($n_i$) and electron charge ($n_e$) at the surface produces a voltage across the sheath (102). For an inductive plasma, sheath voltages typically range from 20-40 V and are a few Debye lengths in width (w). Since these voltages are relatively low, sputtering is usually not the primary concern for an inductive plasma. However, increased transient voltages are likely during plasma based atomic scale processing at various stages of the plasma dose/exposure steps, resulting in a more capacitive component to the plasma with a higher sputter yield (e.g., during initial lighting of the plasma). Alumina is well known for its chemical stability and low sputter yield; therefore, to ensure surfaces exposed directly to plasma are resistant to reactive and/or physical etching, sapphire and/or ceramic alumina overlayers may be utilized.

According to another aspect, atomic scale processing, such as that performed by one of the aforementioned atomic scale processing techniques, may be configured to control (vs. reduce) the partial pressure of certain background species within a UHP environment to modify surface chemistry during film growth and/or etch. For example, a continuous background of $O_2$ gas and/or $H_2O$ vapor can be maintained at a specific level (e.g., $10^{-7}$ Torr partial pressure) in reactor (100) by means of supplemental precursor delivery to control the doping level of oxygen in non-oxide based materials such as nitride films.

With reference to FIG. 16, an exemplary supplemental precursor delivery arrangement (80b) is provided. In said precursor delivery arrangement (80b), a compressed gas cylinder (82) containing a precursor (e.g., $O_2$ gas) is in communication with a reservoir (84). On the line that connects the compressed gas cylinder (82) to the reservoir (84), a regulator (86) is provided. Moving from the regulator (86) towards the reservoir (84), a first orifice (88) is provided, followed by a first valve (90). When a valve of the compressed gas cylinder (82) is open, such that precursor may flow out of the cylinder, the precursor gas will flow through the regulator (86), the first orifice (88), the first valve (90), and into the reservoir (84). From the reservoir (84), the line leads to a pressure gauge (92). After the pressure gauge (92), the line leads to a second orifice (94) and then to a second valve (96). After the second valve (96), the line then connects with the reactor (100), or with reactor (100) via process gas source (12). Thus, after the precursor gas enters the reservoir (84), it travels past the pressure gauge (92), through a second orifice (94), through a second valve (96), and is then able to travel to the reactor (100). The regulator (86) may be used to control the line pressure between the compressed gas cylinder (82) and the reservoir (84). The first orifice (88) may be used to control flow, and the first valve (90) to enable or disable the flow of precursor from the compressed gas cylinder (82) into reservoir (84). Similarly, the second orifice (94) may be used to control flow, and the second valve (96) to enable or disable the flow of precursor from the reservoir (84) into the reactor (100). The pressure gauge (94) may be used to monitor the pressure in the reservoir (84). According to the desired reactor (100) pressure, the regulator (86) and reservoir (84) pressures, as well as the first orifice (88) and second orifice (94) sizes, may be chosen to enable choked flow and obtain the desired flow rates into the reservoir (84) and the reactor (100). The aforementioned configuration of precursor delivery components, as shown in FIG. 16, enables proper flow and pressure control for effective supplemental precursor delivery. For example, system control software can use feedback from the pressure gauge (92) to maintain the pressure inside reservoir (84) by cycling the first valve (90) and allowing gas flow through the first orifice (88) and into the reservoir (84). The supplemental precursor flow can be maintained by opening the second valve (96) thereby allowing flow through the second orifice (94) and into the reactor (100). This configuration of the delivery system, for gas phase precursors, provides extremely precise control over supplemental precursor flow into the reactor (100).

With reference to FIG. 17, an alternative precursor delivery configuration would be to route the line from the regulator (86) directly to the second orifice (94). In this configuration, once the precursor gas exits the compressed gas cylinder (82), precursor gas flows from the regulator (86), through the second orifice (94), the second valve (96) and into the reactor (100). Still further, a premixed inactive process gas, such as argon, may contain the desired level of supplemental precursor. With reference to FIG. 18, for vapor phase precursors such as water vapor, a precursor ampoule (98) may be connected to the first valve (90) and then may be connected directly to the second orifice (94). Thus, once the vapor phase precursor exits the ampoule (98), the vapor phase precursor travels through the first valve (90), the second orifice (94), and the second valve (96), before the vapor phase precursor is able to enter the reactor (100) or one of the various reactor components included herein.

The line pressure in this case depends only on the precursor temperature (as shown for TDMAT in FIG. 9). Therefore, extremely precise vapor delivery can be achieved by maintaining a fixed precursor temperature. This configuration of the delivery system, for vapor phase precursors, also provides extremely precise control over supplemental precursor flow into the reactor (100).

Figures 19, 20:
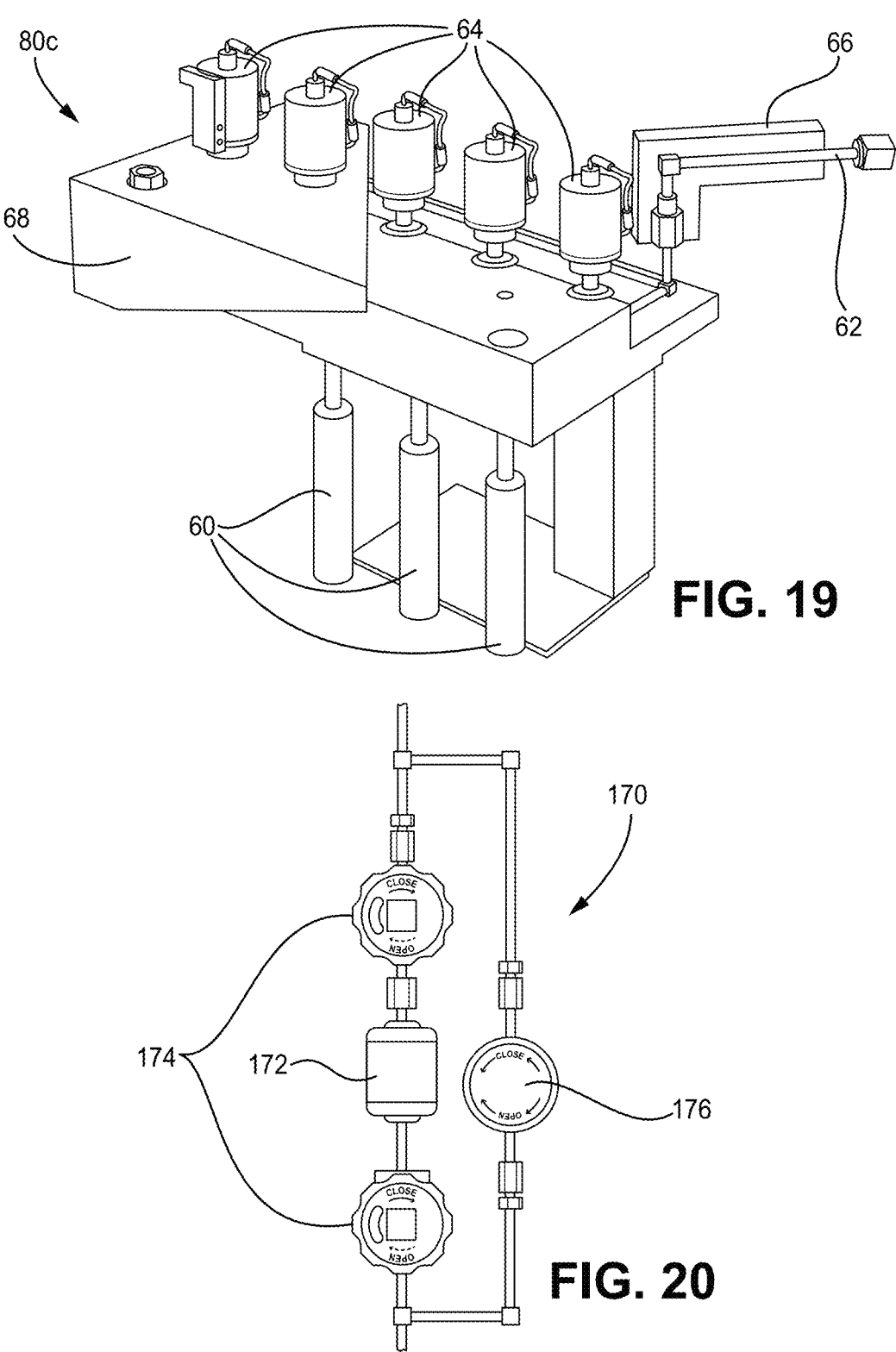
FIG. 19 is a front view of a precursor/reactant vapor delivery arrangement according to another aspect of the present disclosure.
FIG. 20 is a front view of a gas purification arrangement according to another aspect of the present disclosure.

With reference to FIG. 19, a precursor vapor delivery arrangement (80*c*) is provided. The precursor vapor delivery arrangement (80*c*) may be similar to the precursor vapor delivery arrangement (80*b*), but with a plurality of precursor ampoules (60) and a plurality of valving (64). Each precursor ampoule (60) of the plurality of precursor ampoules (60) may be in communication with a valving (64) of the plurality of valving (64). The plurality of precursor ampoules (60) and plurality of valving (64) may be in communication with the reactor (100) through a line to the reactor (62). A single line to the reactor (62) may in communication with each precursor ampoule (60) and allow for the precursor vapor to flow into the reactor. Each valving (64) may be open or closed to allow or prevent the flow of the precursor from each precursor ampoule (60). Cladding (66) may be provided around each ampoule (60) of the plurality of ampoules (60), each valving (64) of the plurality of valving (64) and/or the line to the reactor (62) to aid in thermal management. The cladding (66) may be Al cladding, or some other suitable thermal mass with sufficient thermal conductivity, for example, copper. The cladding (66) may be in the form of a solid structure that wraps around the component, or may be a different structure, such as in the form of beads. The precursor vapor delivery arrangement (80*c*) may include heater jackets (68), or some other suitable means of supplying thermal energy, around at least a portion of the plurality of ampoules (60), the plurality of valving (64), and/or the line to the reactor (62). The precursor vapor delivery arrangement (80*c*) may include one or more independently controlled heat zones to further aid in temperature management. The precursor vapor delivery arrangement (80*c*) also includes a MFC, located upstream from the plurality of valving (64), which provides continuous, viscous-laminar inactive gas flow through the plurality of valving (64) and line to the reactor (62) for effective vapor delivery and subsequent purging of the delivery components (see FIG. 26). The combination of continuous, inactive gas flow from the one or more said precursor vapor delivery arrangements (80*a*) and/or (80*c*), as well as process gas source (12) provides a continuous, viscous laminar flow through the reactor (100), exhaust port (50*a*) and foreline (50*b*) to pump (166).

UHP conditions are based on impurity partial pressures below $10^{-6}$ Torr within the internal volume (156) of the reactor (100) to limit their role in surface reactions before, during and after film growth and/or etch by atomic scale processing techniques, such as limiting the incorporation of background oxygen impurities in nitride thin films by PEALD. According to the principles of the invention of this disclosure, UHP conditions are realized without a base pressure requirement of below $10^{-6}$ Torr within the internal volume (156) of reactor (100). Therefore, high-vacuum pumping (i.e., a turbomolecular pump) is not required to create and maintain a UHP process environment according to the principles established herein. Any suitable chemical series mechanical may be used such that the base pressure within the internal volume (156) of reactor (100) may be in the range of $10^{-4}$ to $10^{-2}$ Torr. For example, a chemical series dry pump with pumping speed in the range of 5-50 Liters/sec is suitable for creating and maintaining said UHP process conditions.

With reference to FIG. 20, a gas purification arrangement (170) may be used to reduce or control background impurities (e.g., $O_2$, $H_2O$, CO, $CO_2$) in a process gas. The gas purification arrangement (170) may include a gas purifier (172) that is configured to remove undesired background impurities from the process gas. At either or both ends of the gas purifier (172), manual valves (174) may be provided that open and close to isolate the gas purifier (172). The gas purification arrangement may include a bypass channel (176) that may be open or closed and is configured to prevent purification when the reactor (100) is not in use for protection and prolonged operation of the gas purifier (172). One end of the gas purification arrangement (170) may be attached to a gas source. When attached, the gas contained at the gas source flows into the gas purification arrangement (170). The gas will then travel through the gas purifier (172) or the bypass channel (176), depending on if the manual valves (174) are open or closed. The other end of the gas purification arrangement (170) may be in communication with the reactor (100) such that after the gas travels through the gas purifier (172) or the bypass channel (176), the gas will then flow into the reactor (100).

Figures 21, 22:
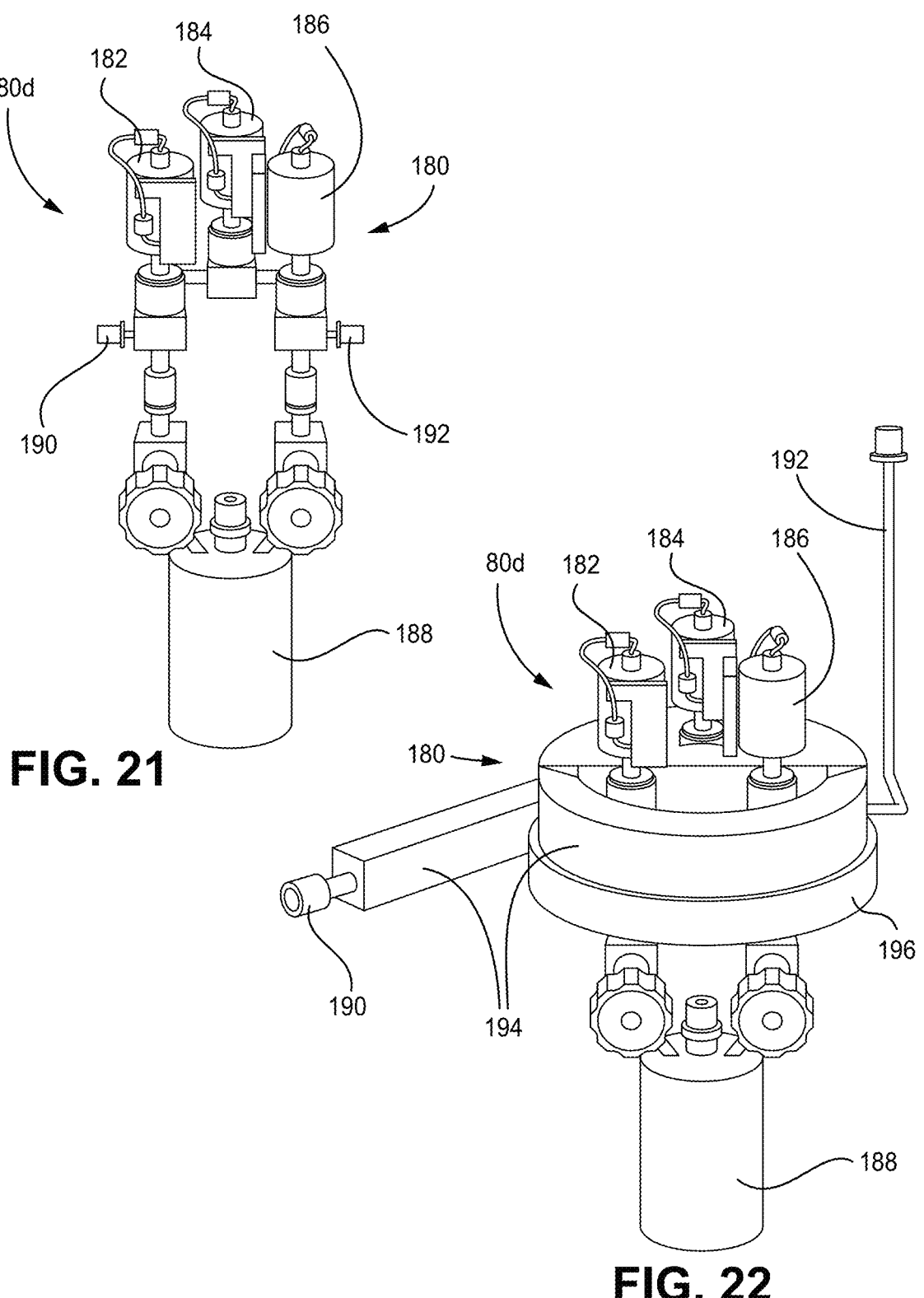
FIG. 21 is a front view of a precursor/reactant vapor delivery arrangement according to another aspect of the present disclosure.
FIG. 22 is a front view of a precursor/reactant vapor delivery arrangement according to another aspect of the present disclosure.

With reference to FIG. 21, a precursor vapor delivery arrangement (80*d*) is provided. The precursor vapor delivery arrangement (80*d*) may include a carrier gas input line (192) that is in communication with a carrier gas source to allow a carrier gas to flow into the precursor vapor delivery arrangement (80*d*). The precursor vapor delivery arrangement (80*d*) may include a carrier gas output line (190) that is in communication with the reactor (100) to allow the carrier gas to flow out of the precursor vapor delivery arrangement (80*d*) and into the reactor (100). The precursor vapor delivery arrangement (80*d*) may include an ampoule (188) that includes a liquid or solid phase precursor. The precursor vapor delivery arrangement (80*d*) may include a valve manifold (180). The valve manifold (180) may include an input valve (186) that may be open or closed. When the input valve (186) is open, the input valve (186) allows the carrier gas from the carrier gas input line (192) to flow into the ampoule (188). When the input valve (186) is closed, the input valve (186) prevents the carrier gas from entering the ampoule (188). The valve manifold (180) may include an output valve (182) that may be open or closed. When the output valve (182) is open, the output valve (182) allows the carrier gas present in the ampoule (188) to flow out of the ampoule (188) and into the carrier gas output line (190). When the output valve (182) is closed, the output valve (182) prevents the carrier gas from exiting the ampoule (188). The valve manifold (180) may include a bypass valve (184) that may be open or closed. When the bypass valve (184) is open, the bypass valve (184) allows the carrier gas to flow from the carrier gas input line (192) to the carrier gas output line (190) without entering the ampoule (188).

When dosing of a precursor to the reactor (100) is not needed, the input valve (186) and the output valve (182) may be closed and the bypass valve (184) may be open such that the carrier gas cannot flow to the ampoule (188) to pick up the precursor vapor in the ampoule (188), but instead, the carrier gas flows from the carrier gas input line (192) to the bypass valve (184) and then to the carrier gas output line (190). The carrier gas flow rate may be from approximately 10 to 100 standard cubic centimeters per minute (sccm). When precursor dosing is needed, the bypass valve (184) is closed and the input valve (186) and the output valve (182) are opened, simultaneously. This configuration allows the carrier gas to flow from the carrier gas input line (192), into the ampoule (188) where the carrier gas picks up the precursor vapor therein, and then the carrier gas with the precursor vapor into the carrier gas output line (190) which transports the carrier gas and the precursor vapor to the reactor (100). Alternatively, during precursor dosing, the bypass valve (184) may be closed and only the input valve (186) may be opened, simultaneously, leaving the output valve (182) closed. This configuration allows carrier gas to flow from the carrier gas input line (192) to the ampoule (188) without letting the carrier gas exit the ampoule (188) to the carrier gas output line (190). This valve configuration allows for pressure in the ampoule (188) head-space to increase, such as an increase to 10-20 Torr inside the ampoule (188), compared to the approximate pressure inside the reactor (100) of 1 Torr. Once a sufficient pressure increase in the ampoule (188) is achieved, the output valve (182) may be opened, thereby allowing the carrier gas with precursor vapor to flow into the carrier gas output line (190) and then to the reactor (100). The increased pressure inside the ampoule (188) head-space from the output valve (182) being closed allows for the carrier gas and precursor vapor to be more easily distributed inside the reactor (100) and across the substrate surface (118). When dosing is completed, the bypass valve (184) may be opened and the input valve (186) and the output valve (182) may be closed, simultaneously, thus allowing the carrier gas to flow from the carrier gas input line (192), to the bypass valve (184), and then to the carrier gas output line (190), thereby avoiding the ampoule (188) to prevent dosing and enable purging for the delivery channel. The precursor vapor delivery arrangement (80*d*) may include one or more independently controlled heat zones to aid in temperature management. For example, the precursor vapor delivery arrangement (80*d*) may include a first independently controlled heat zone at the ampoule (188). The precursor vapor delivery arrangement (80*d*) may include a second independently controlled heat zone at the valve manifold (180). The precursor vapor delivery arrangement (80*d*) may include a third independently controlled heat zone around the carrier gas output line (190). The precursor vapor delivery arrangement (80*d*) may also include a MFC, located upstream from the valve manifold (180), which provides continuous, viscous-laminar inactive gas flow through the valve manifold (180) and the carrier gas output line (190) for effective vapor delivery and subsequent purging of the delivery components (see FIG. 26).

With reference to FIG. 22, the precursor vapor delivery arrangement (80*d*) may include cladding (194) around at least one of the various surfaces of the precursor vapor delivery arrangement (80*d*) in order to effectively maintain temperature uniformity. For example, cladding (194) may be provided around at least a portion of the valve manifold (180), such as around at least a portion of the input valve (186), the bypass valve (184), and/or output valve (182). Cladding (194) may be provided around at least a portion of the carrier gas output line (190). The cladding (194) may be a metallic material. For example, the cladding (194) may be aluminum (Al) cladding. Alternatively, or in addition to the aluminum cladding, the cladding (194) may comprise some other suitable thermal mass with sufficient thermal conductivity to control the temperature of the components where the cladding (194) is present. For example, different metallic material may be used for the cladding (194), such as copper (Cu), in addition or alternatively to aluminum. The cladding (194) may be in the form of a solid structure that wraps at least partially around the valve manifold (180) and/or the carrier gas output line (190). Alternatively, the cladding (194) may take a different form. For example, the cladding (194) may be in the form of beads that cover at least a portion of the surfaces of the valve manifold (180) and/or the carrier gas output line (190).

Figures 23, 24:
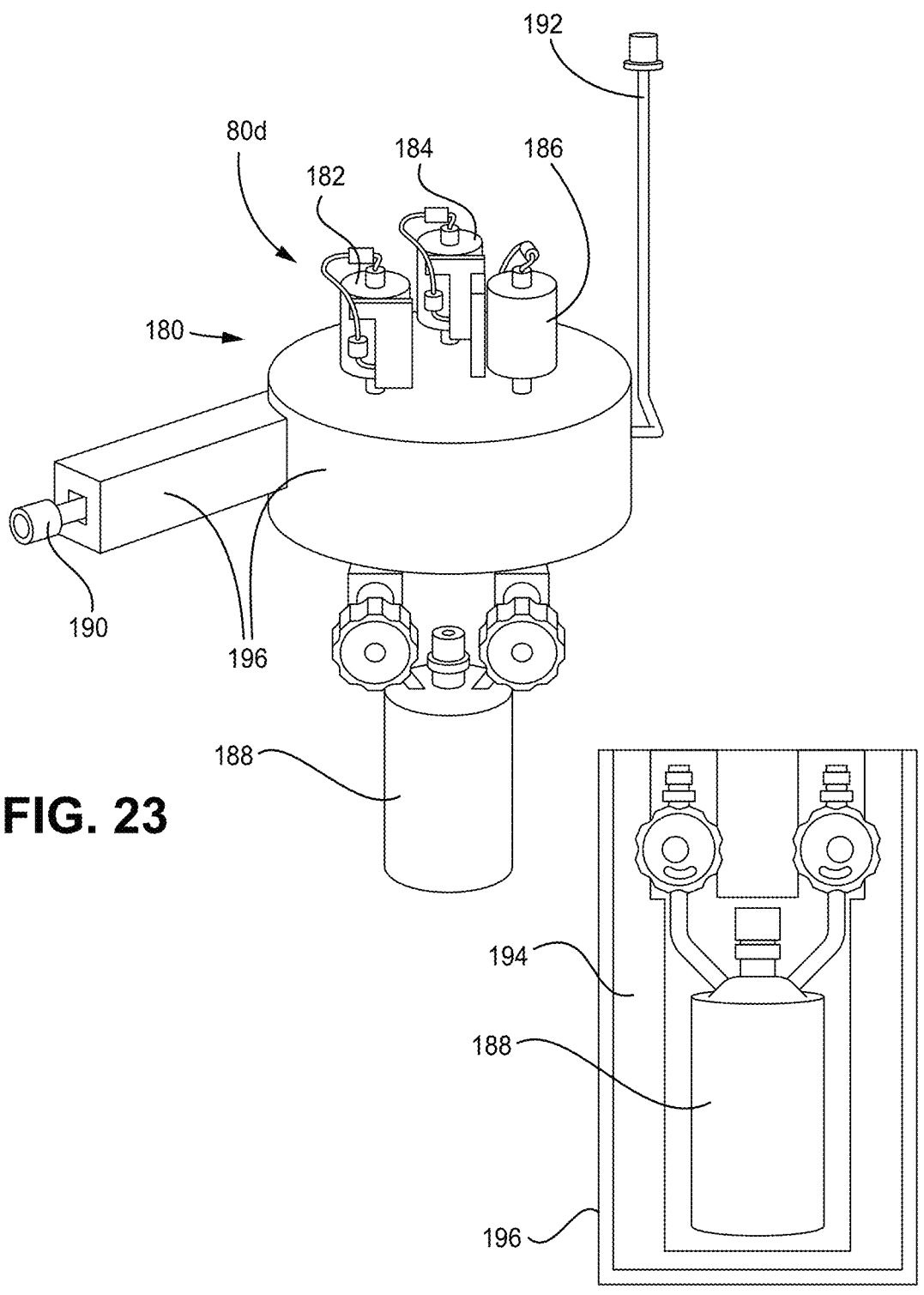
FIG. 23 is a front view of a precursor/reactant vapor delivery arrangement according to another aspect of the present disclosure.
FIG. 24 is a front view an ampoule of a precursor/reactant vapor delivery arrangement according to another aspect of the present disclosure.

With reference to FIG. 23, in addition to or as an alternative for the cladding (194), The precursor vapor delivery arrangement (80d) may include one or more heater jackets (196), or some other suitable means of supplying thermal energy, at least partially around one or more of the surfaces of the precursor vapor delivery arrangement (80d) to aid in temperature management. For example, a heater jacket (196), or some other suitable means of supplying thermal energy, may be provided around at least a portion of the valve manifold (180), such as around the input valve (186), the bypass valve (184), and/or the output valve (182). A heater jacket (196), or some other suitable means of supplying thermal energy, may be provided around at least a portion of the carrier gas output line (190). In some non-limiting embodiments, a heater jacket (196) may be provided around the entire surface of the valve manifold (180) and/or the carrier gas output line (190).

With reference to FIG. 24, the ampoule (188) of the precursor vapor delivery arrangement (80d) is provided. The ampoule (188) may include cladding (194) around at least portion of the ampoule (188) to aid in thermal management. The cladding (194) around the ampoule (188) may be the same as the cladding (194) around the valve manifold (180) and/or the carrier gas output line (190), such as comprising the same materials and/or structures. In one non-limiting embodiment, the cladding (194) may be provided around the entire circumference of the ampoule (188). The ampoule (188) may include, in addition to or as an alternative for the cladding (194), at least one heater jacket, or some other suitable means of supplying thermal energy, (196) around at least a portion of the ampoule (188) to aid in thermal management. The heater jacket (196), or some other suitable means of supplying thermal energy, provided around the ampoule (188) may be the same as the heater jacket (196) provided around the valve manifold (180) and/or the carrier gas output line (190). In one non-limiting embodiment, the heater jacket (196), or some other suitable means of supplying thermal energy, may be provided around the entire circumference of the ampoule (188).

Figure 25:
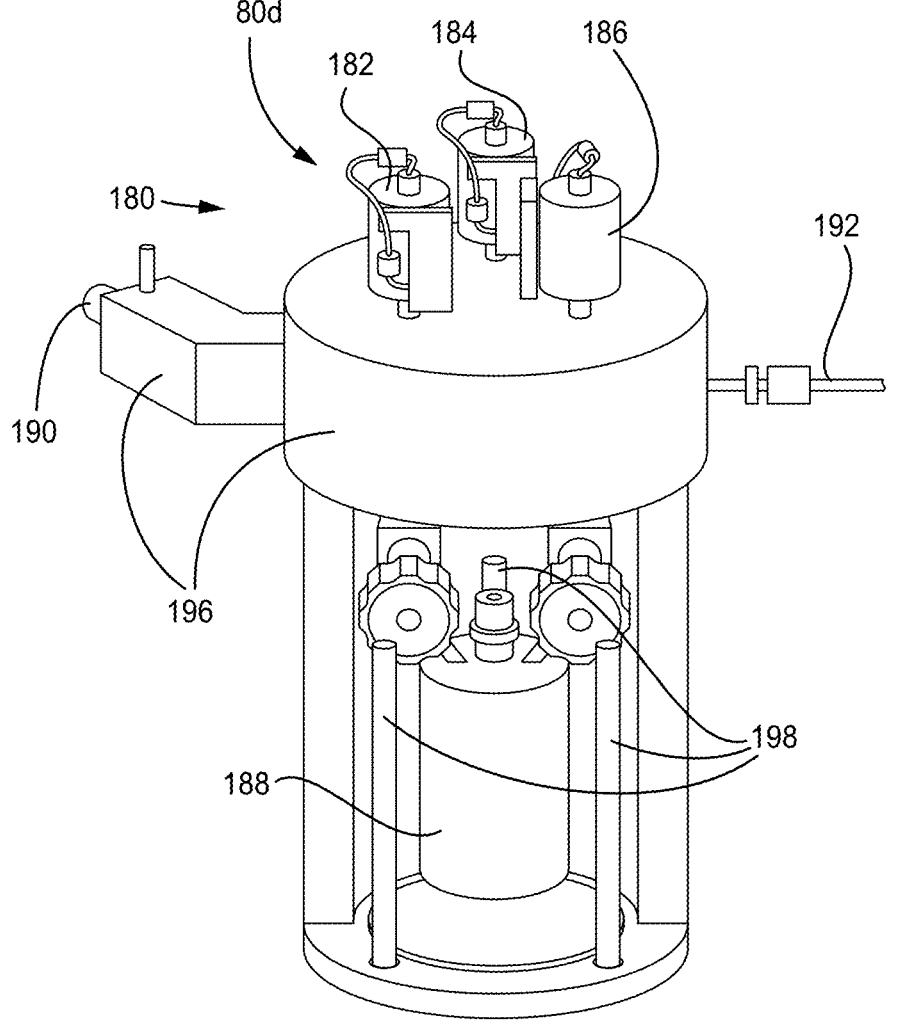
FIG. 25 is a front view of a precursor/reactant vapor delivery arrangement according to another aspect of the present disclosure.

With reference to FIG. 25, the precursor vapor delivery arrangement (80d) may include a lower oven enclosure to aid in temperature management. The lower oven enclosure may include a heater jacket (196), or some other suitable means of supplying thermal energy, around at least a portion of the ampoule (188). In one non-limiting embodiment, the heater jacket (196), or some other suitable means of supplying thermal energy, may be provided around the entire circumference of the ampoule (188). The heater jacket (196) may be the same as the heater jacket (196) provided around the valve manifold (180) and/or the carrier gas output line (190). The lower oven enclosure may include at least one cartridge heater (198) between the ampoule (188) and the heater jacket (196) to aid in temperature management. The lower oven enclosure may include at least two heater cartridges (198), such as two heater cartridges (198), spaced equally apart from each other, between the ampoule (188) and the heater jacket (196). For example, the lower oven enclosure may include at least three heater cartridges (198), such as three heater cartridges (198), spaced equally apart from each other, between the ampoule (188) and the heater jacket (196).

Figure 26:
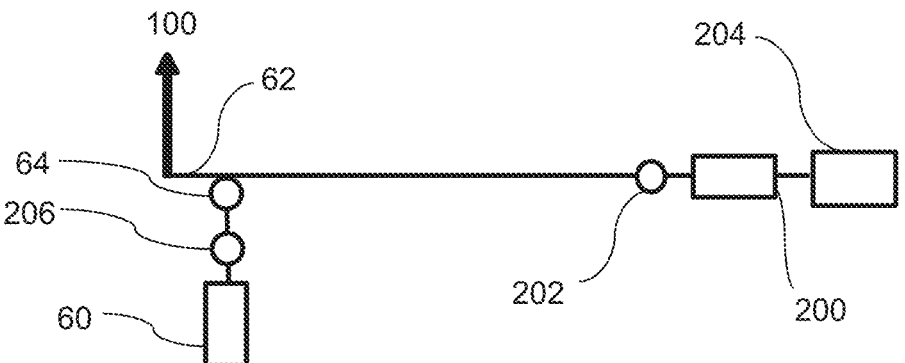
FIG. 26 is a schematic of an MFC arrangement for implementing with any of the precursor/vapor delivery arrangement disclosed herein according to another aspect of the present disclosure.

With reference to FIG. 26, an MFC arrangement is provided that may be implemented upstream from any of the precursor vapor or gas delivery arrangements disclosed herein. For example, the MFC arrangement of FIG. 26 may be implemented upstream from the process gas source (12) of FIG. 2, precursor vapor delivery arrangements (80a) of FIG. 8, the precursor vapor delivery arrangement (80c) of FIG. 19, and/or the precursor vapor delivery arrangement (80d) of FIG. 21. As a non-limiting example, FIG. 26 includes the precursor vapor delivery arrangement (80a) of FIG. 8, however, it is noted that both the precursor vapor delivery arrangement (80c) of FIG. 19 and the precursor vapor delivery arrangement of FIG. 21 may also include the MFC arrangement of FIG. 26. In FIG. 26, a precursor vapor delivery arrangement including an ampoule (60) with a manual valve (206) that may be open or closed, valving (64), and a line to the reactor (62) that connects the ampoule (60) to the reactor (100) are provided. If the manual valve (206) is open then the precursor vapor is able to exit the ampoule (60), and if the manual valve (206) is closed then the precursor vapor is unable to exit the ampoule (60). An MFC arrangement is provided upstream of the precursor vapor delivery arrangement and in communication with the valving (64) and the line to the reactor (62). The MFC arrangement includes an inactive gas source (204). For example, the inactive gas source (204) may contain Ar or $N_2$. An MFC (200) may be in communication with the inactive gas source (204). The MFC (200) may be used to control the continuous flow of inactive Ar and/or $N_2$ process gas through the valving (64) and the line to the reactor (62). Continuous, viscous-laminar inactive gas flow serves as a carrier gas during precursor delivery/dose steps, and as a purge gas during subsequent purge steps. This inactive gas flow also creates a diffusion barrier to prevent unwanted back-diffusion of downstream impurities into the vapor delivery channel. The MFC arrangement further includes a valve (202) that may be open or closed to allow or prevent inactive gas flow to the valving (64) and the line to the reactor (62). The valve (202) is in communication with both the MFC (200) and the valving (64). If one or more of the MFC arrangements is to be implemented with the process gas source (12) of FIG. 2, one or more valve (202) will be in communication with one or more MFC (200) and process gas source (12). If the MFC arrangement is to be implemented with the precursor vapor delivery arrangement (80c) of FIG. 19, the valve (202) will be in communication with the MFC (200) and the plurality of valving (64). If the MFC arrangement is to be implemented with the precursor vapor delivery arrangement (80d) of FIG. 21, the valve (202) will be in communication with both the MFC (200) and the valve manifold (180).

Figure 27:
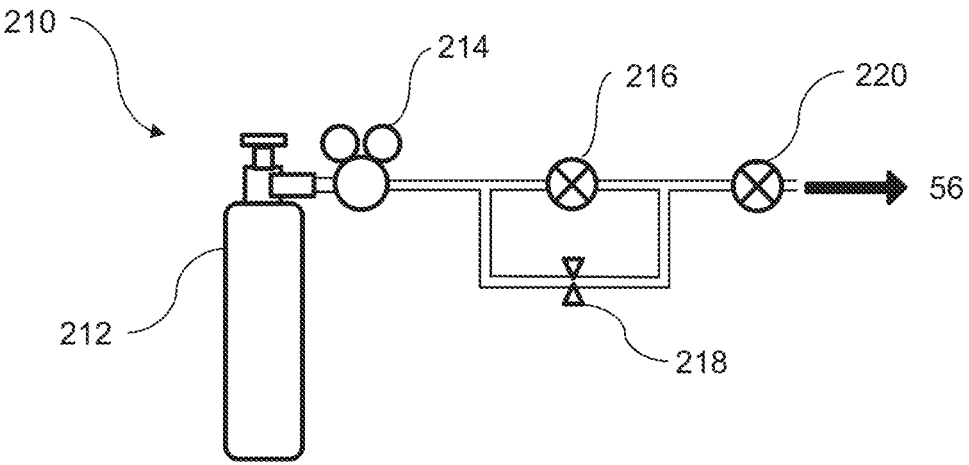
FIG. 27 is a schematic of a gas flow arrangement for implementing at the downstream port of FIG. 6 according to another aspect of the present disclosure.

With reference to FIG. 27, a gas flow arrangement (210) for supplying gas to the downstream port (56) is provided. The gas flow arrangement (210) can be implemented at the downstream port (56) shown in FIG. 6. The gas flow arrangement (210) may comprise a compressed gas cylinder (212) in communication with a regulator (214). The regulator (214) may be used to control the line pressure between the compressed gas cylinder (212) and the downstream port (56). An isolation valve (220) that can be open or closed may be in communication with the compressed gas cylinder (212) and the downstream port (56). When the isolation valve (220) is open, gas is able to flow from the compressed gas cylinder (212) to the downstream port (56). When the isolation valve (220) is closed, gas is unable to flow from to the downstream port (56) from the compressed gas cylinder (212). The gas flow arrangement (210) may include a vent valve (216) that may be open or closed and in communication with the compressed gas cylinder (212) and the isolation valve (220). The gas flow arrangement (210) may further include a purge orifice (218) that is also in communication with the compressed gas cylinder (212) and the isolation valve (220), but is not in communication with the vent valve (216) such that when the vent valve (216) is closed, the gas from the compressed gas cylinder (212) may still travel to the isolation valve (220) and the downstream port (56) by traveling through the purge orifice (218). The gas flow arrangement (210) is configured to enable the downstream port (56) to provide purge and vent protection to reduce the potential for pump back-diffusion and back-streaming of impurities, such that the downstream port (56) is able to provide continuous, viscous-laminar gas flow when the reactor (100) is not in communication with the pump (166). When the pump (166) is on and the pump isolation valve (54) is closed, the vent valve (216) is closed, such that the gas from the compressed gas cylinder (212) must travel through the purge orifice (218) to provide a low conductance path of travel for the gas to prevent the introduction of impurities into the foreline (50b) from the pump (166). When the pump (166) is turned off and the pump isolation valve (54) is closed, the vent valve (216) is opened such that the gas from the compressed gas cylinder (212) travels through the vent valve (216) to enable a high conductance path of travel for the gas to rapidly bring the foreline (50b) up to atmospheric pressure to avoid back-streaming of impurities from the pump (166).

The following Examples are presented to demonstrate the general principles of the invention of this disclosure and the effectiveness of UHP process conditions. The invention should not be considered as limited to the specific examples presented.

EXAMPLES

The following examples were conducted under UHP process conditions. UHP process conditions are fully enabled by addressing each of the various sources of background impurities described above. System leaks were addressed by thoroughly leaking testing all system components to ensure no atmospheric leaks, and no internal leaks of process gas and/or vapor across valve seats. Background impurities introduced through contaminated process gas were addressed by installing gas purifiers (SAES Micro Torr and Entegris Gatekeeper) on the primary delivery lines for Ar, $N_2$, and $H_2$ gases which reduce oxygen impurities below ppb levels. Elastomeric permeation was addressed by only using metal and differentially pumped elastomer seals on all connection points, except for the four connection points positioned below the plane of the substrate and the connection between the reactor lid and the precursor input adapter which are welded together. Process pump back-diffusion was addressed by maintaining a continuous viscous-laminar Ar flow to establish a diffusion barrier preventing back-diffusion of all downstream impurities, including oxygen species introduced by o-ring permeation. The continuous viscous-laminar Ar flow also prevented back-diffusion of oxygen (and other impurities) from the reactor foreline and/or vacuum pump. To ensure sufficient outgassing of any absorbed water on internal components, the majority of the reactor surfaces were continuously heated and purged with UHP Ar process gas. In particular, delivery source components directly exposed to precursor vapor were kept at 150° C. to prevent long residence times within delivery channels. The reactor lid and reactor walls were maintained at 160° C. and 165° C., respectively. Al cladding surrounded by heater jackets were used on all delivery components (including the reactor lid) to achieve temperature uniformity. Outgassing of absorbed $H_2O$ on non-heated reactor surfaces (e.g., non-heated sections of process gas delivery lines and components) was achieved by purging these components with UHP Ar processing. UHP conditions for atomic scale processing enables background oxygen incorporation below 2 at. %, such as below 1 at. % for non-oxide based film growth as demonstrated by the following examples.

The following Examples were prepared as follows. Depositions were performed in an ALD150LX perpendicular-flow reactor (commercially available from the Kurt J. Lesker Company) equipped with a chemical series vacuum pump having a nominal pumping speed of 44 cubic feet per minute (cfm) (i.e., 21 Liters·sec (L/s)). Plasma was generated by a remote ICP source operating at 13.56 megahertz (MHz) frequency and 975 Watt (W) plasma power. A fused silica ($SiO_2$) plasma tube provided a transparent window for radio frequency (RF) signal transmission between an external, silver-coated copper, RF coil and the plasma gas. Analytical ports equipped with fused silica viewports enabled in situ process monitoring by ellipsometry. An integrated load-lock equipped with a turbomolecular pump was used for sample transfer. Titanium nitride (TiN$_x$), aluminum nitride (AlN$_x$), and silicon nitride (SiN$_x$) PEALD were performed at approximately 1 Torr pressure on untreated 150 mm Si (100) wafers.

Film thickness was determined ex situ by spectroscopic ellipsometry (SE) using a M-2000 spectroscopic ellipsometer (commercially available from J. A. Woollam) over a range of wavelengths from 193-1000 nm. For the TiN$_x$ Examples below, a Drude-Lorentz model was used to analyze the SE data and extract film thickness. For the AlN$_x$ and SiN$_x$ Examples below, a Cauchy model was used determine the film thickness. Ellipsometry measurements were also performed in situ to determine film thickness and resistivity during TiN$_x$ growth using a FS-1EX multi-wavelength ellipsometer (commercially available from Film Sense). The FS=1EX provides 6 wavelengths of ellipsometric data (405, 450, 525, 660, 850 and 950 nm). Film composition was measured by depth profile x-ray photoelectron spectroscopy (XPS) using a VersaProbe II instrument (commercially available from Physical Electronics) equipped with a monochromatic Al kα x-ray source (1486.7 electron volts (eV)) and a concentric hemispherical analyzer. To optimize the analysis for carbon and oxygen (two elements common to the background levels in XPS), the samples were pre-pumped overnight in the analytical chamber while cycling a titanium sublimation pump. Quantification utilized instrumental relative sensitivity factors (RSFs) that account for the x-ray cross section and inelastic mean free path of the electrons. For the major elements (Ti, Al, Si, N), the 1 sigma (1σ) quantitative accuracy is expected to be within ±10 relative % (rel %). Due to poor counting statistics, and finite backgrounds of carbon and oxygen, the 1σ accuracy is expected to be within ±20-40 rel % for the minor elements. Ion sputtering was accomplished using a 2 kilovolt (kV) Ar$^+$ ion beam. Elemental depth profiling was also performed by secondary ion mass spectroscopy (SIMS) utilizing a Adept 1010 quadrupole instrument (commercially available from Physical Electronics). Measurements utilized 1 kV cesium$^+$ (Cs$^+$) ion bombardment. Negative ions were detected. Elemental quantification was based on RSFs calculated from an implanted TiN film reference material. The 1σ quantitative accuracy is expected to be ±5-30 rel %.

Example 1

Figure 28:
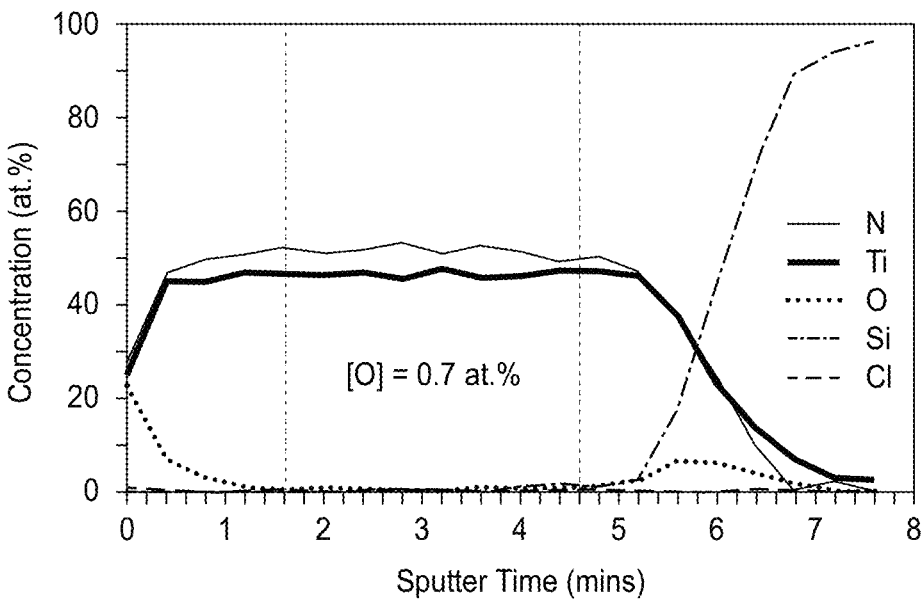
FIG. 28 is a graph of the concentration of various elements versus the sputter time of a $TiN_x$ film obtained from x-ray photoelectron spectroscopy (XPS)

Example 1 was prepared by depositing a titanium nitride (TiN$_x$) film according the aforementioned procedure under UHP conditions. The TiN$_x$ film was deposited in a UHP environment using titanium tetrachloride (TiCl$_4$) and a mixture of Ar, $H_2$, and $N_2$ (Ar—$N_2$—$H_2$) plasma species at 350° C. substrate temperature. The growth-per-cycle (GPC) was 0.33 Å/cycle. The TiN$_x$ film had a thickness of 33 nm as determined by a M-2000 spectroscopic ellipsometer using a Drude-Lorentz model. X-ray photoelectron spectroscopy (XPS) depth-profile results for PEALD of the $TiN_x$ film are shown in FIG. 28 and demonstrates an average oxygen concentration below 1 at. % in the bulk of the film. The oxygen concentration for the $TiN_x$ film was averaged between 1.6-4.6 minute sputtering time to obtain the bulk value. This bulk average corresponds to an oxygen concentration of 0.7 at. % for the $TiN_x$ film.

Figure 29:
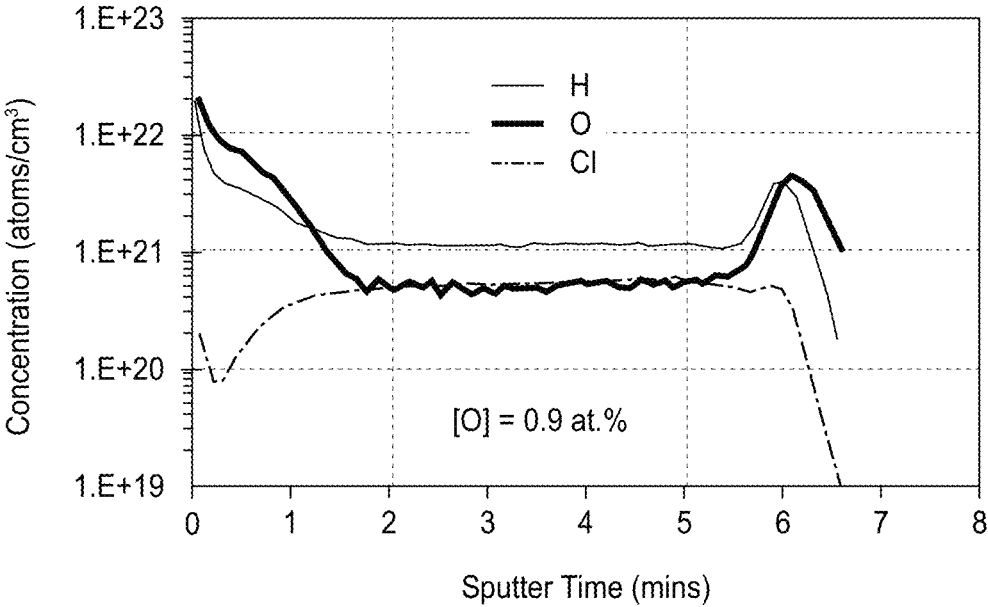
FIG. 29 is a graph of the concentration of various elements versus the sputter time of a $TiN_x$ film obtained from secondary ion mass spectroscopy (SIMS)

The same $TiN_x$ film of Example 1 also underwent depth-profile secondary ion mass spectroscopy (SIMS). As shown in FIG. 29, the $TiN_x$ film shows an oxygen concentration of less than 1 at. %, thus, is in good agreement with the previously discussed XPS results. The oxygen concentration (in atoms/cm$^3$) for the $TiN_x$ film was averaged between 2-5 minute sputter time and then converted to at. % of oxygen using the bulk density of TiN (5.21 g/cm$^3$). The oxygen concentration determined by SIMS was 0.9 at. % for the $TiN_x$ film.

The results for both XPS and SIMS of the $TiN_x$ film are tabulated in Table 1 below. The reported uncertainties represent the ±1σ variation associated with at. % averages over the specified range.

TABLE 1

| Technique | Sample | Ti (at. %) | N (at. %) | O (at. %) | Cl (at. %) | H (at. %) |
|---|---|---|---|---|---|---|
| XPS | TiN (Baseline) | 47 ± 1 | 52 ± 1 | 0.7 ± 0.2 | 0.2 ± 0.1 | n/a |
| SIMS | TiN (Baseline) | n/a | n/a | 0.9 ± 0.08 | 1.0 ± 0.05 | 2.1 ± 0.03 |

Example 2

Figure 30:
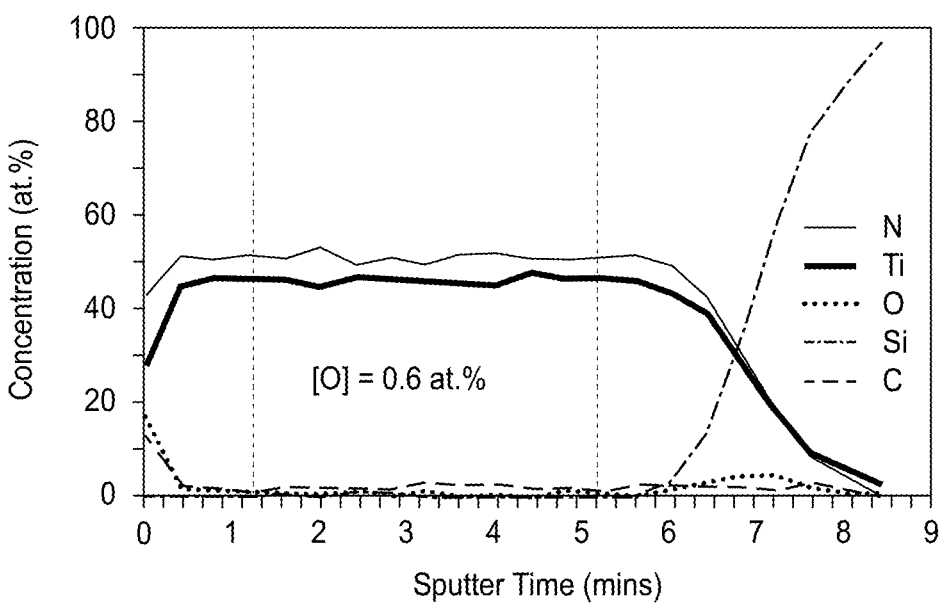
FIG. 30 is a graph of the concentration of various elements versus the sputter time of a $TiN_x$ film obtained from XPS.

For Example 2, a $TiN_x$ film was deposited using TDMAT and Ar—N$_2$ plasma mixture at 250° C. substrate temperature. The GPC of Example 2 was 0.75 Å/cycle. The $TiN_x$ film had a thickness of 30 nm as determined by a M-2000 spectroscopic ellipsometer using a Drude-Lorentz model. Depth-profile XPS was conducted for the $TiN_x$ film formed using TDMAT. The results of the XPS of the $TiN_x$ film are shown in FIG. 30. The graph of FIG. 30 demonstrates an oxygen concentration for the $TiN_x$ film below the threshold of 1 at. %. The oxygen concentration for the $TiN_x$ film was averaged between 1.2-5.2 minute sputter time to obtain the bulk values. This bulk value corresponds to an oxygen concentration of 0.6 at. % for the $TiN_x$ film.

Figure 31:
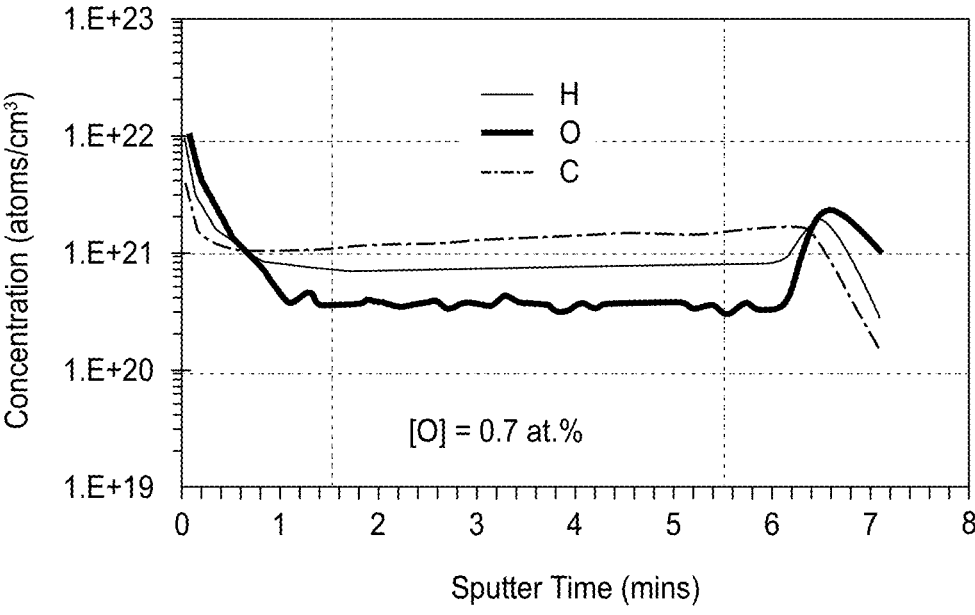
FIG. 31 is a graph of the concentration of various elements versus the sputter time of a $TiN_x$ film obtained from SIMS.

The same $TiN_x$ film of Example 2 also underwent depth-profile secondary ion mass spectroscopy (SIMS). As shown in FIG. 31, the $TiN_x$ film shows an oxygen concentration of less than 1 at. %, thus, is in good agreement with the previously discussed XPS results. The oxygen concentration (in atoms/cm$^3$) for the $TiN_x$ film was averaged between 1.5-5.5 minute sputter time and then converted to at. % of oxygen using the bulk density of TiN (5.21 g/cm$^3$). The oxygen concentration determined by SIMS was 0.7 at. % for the $TiN_x$ film.

The results for both XPS and SIMS of the $TiN_x$ film are tabulated in Table 2 below. The reported uncertainties represent the ±1σ variation associated with at. % averages over the specified range.

TABLE 2

| Technique | Sample | Ti (at. %) | N (at. %) | O (at. %) | C (at. %) | H (at. %) |
|---|---|---|---|---|---|---|
| XPS | TiN (Baseline) | 46 ± 1 | 51 ± 1 | 0.6 ± 0.4 | 1.9 ± 0.6 | n/a |
| SIMS | TiN (Baseline) | n/a | n/a | 0.7 ± 0.05 | 2.7 ± 0.23 | 1.5 ± 0.03 |

Example 3

Figure 32:
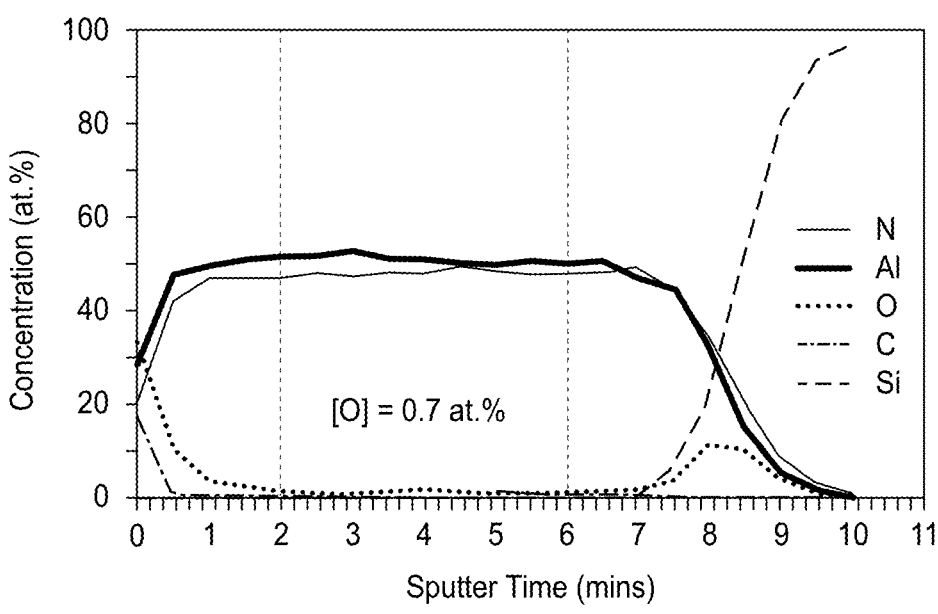
FIG. 32 is a graph of the concentration of various elements versus the sputter time of a $AlN_x$ film obtained from XPS.

For Example 3, an $AlN_x$ film was deposited using trimethylaluminum (TMA) and Ar—N$_2$ plasma mixture at 300° C. substrate temperature. The GPC of Example 3 was 0.95 Å/cycle. The $AlN_x$ film had a thickness of 30 nm as determined by a M-2000 spectroscopic ellipsometer using a Cauchy model. Depth-profile XPS was conducted for the $AlN_x$ film formed using TMA. The results of the XPS of the $AlN_x$ film are shown in FIG. 32. The graph of FIG. 32 demonstrates an oxygen concentration for the $AlN_x$ film below the threshold of 1 at. %. The oxygen concentration was averaged between 2-6 minute sputter time. The oxygen concentration determined by XPS was 0.7 at. % for the $AlN_x$ film.

Example 4

Figure 33:
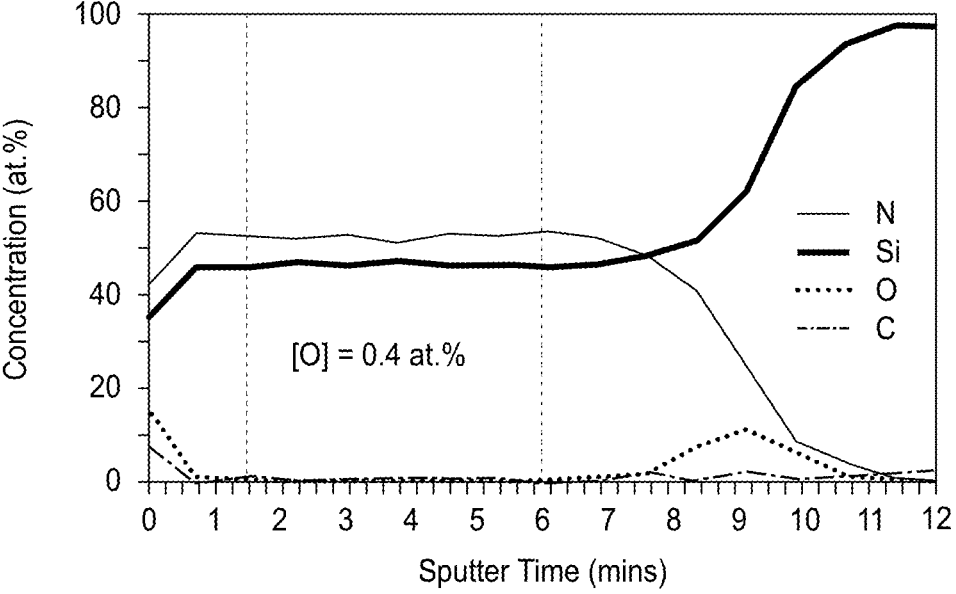
FIG. 33 is a graph of the concentration of various elements versus the sputter time of a $SiN_x$ film obtained from XPS.

For Example 4, a $SiN_x$ film was depositing using tris (dimethylamino)silane (3DMAS) and Ar—N$_2$ plasma mixture at 350° C. substrate temperature. The GPC of Example 4 was 0.13 Å/cycle. The $SiN_x$ film had a thickness of 18 nm as determined by a M-2000 spectroscopic ellipsometer using a Cauchy model. Depth-profile XPS was conducted for the $SiN_x$ film formed from 3DMAS. The results of the XPS for the $SiN_x$ film are shown in FIG. 33. The graph of FIG. 33 demonstrates an oxygen concentration for the $SiN_x$ film below the threshold of 1 at. %. The oxygen concentration was averaged between 1.5-6 minute sputter time. The oxygen concentration determined by XPS was 0.4 at. % for the $SiN_x$ film.

It is to be understood that the invention may assume various alternative variations, except where expressly specified to the contrary. It is also to be understood that the specific devices illustrated in the attached drawings, and described in the specification, are simply exemplary embodiments of the invention. Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope thereof. For example, it is to be understood that the present invention contemplates that, to the extent possible, one or more features of any embodiment can be combined with one or more features of any other embodiment. The embodiments of the invention described herein above in the context of the preferred embodiments are not to be taken as limiting the embodiments of the invention to all of the provided details thereof, since modification and variations thereof may be made without departing from the spirit and scope of the embodiments of the invention.

The invention claimed is:

1. An apparatus r atomic scale processing, comprising:
a reactor having inner and outer surfaces;
wherein at least a portion of the inner surfaces define an internal volume of the reactor;
a fixture assembly positioned within the internal volume of the reactor having a surface configured to hold a substrate within the internal volume of the reactor; and
an inductively coupled plasma source;
wherein the inductively coupled plasma source and the reactor are connected at a first connection point; and
wherein a system control software is provided to establish a partial pressure of each background impurity within the internal volume of the reactor below approximately 10-6 Torr to reduce said background impurities role in surface reactions at least during atomic scale processing.

2. The apparatus of claim 1, further comprising a mechanical pump with a nominal pumping speed of approximately 5 to 50 Liters/sec.

3. The apparatus of claim 1, further comprising:
a process gas source;
wherein the process gas source and the inductively coupled plasma source are connected at a second connection point;
wherein the second connection point comprises a first elastomeric seal and a second elastomeric seal spaced apart from the first elastomeric seal to define a first volume therebetween; and
wherein the second volume is a vacuum, or the second volume is actively purged and/or backfilled with a process gas.

4. The apparatus of claim 1, wherein any connection points spatially located between the first connection point and the fixture assembly comprise metallic and/or elasto- meric seals;
wherein each elastomeric seal connection point comprises at least two elastomeric seals spaced apart to define a volume therebetween; and
wherein the volume is a vacuum, or the volume is actively purged and/or backfilled with a process gas.

5. The apparatus of claim 1, further comprising an exhaust port from the reactor to a pump isolation valve and a foreline from the pump isolation valve to a pump;
wherein a continuous gas flow is maintained in the exhaust port and the foreline when the pump is on, the pump isolation valve is open, and the reactor is in communication with the pump.

6. The apparatus of claim 5, further comprising a down- stream port attached to the foreline;
wherein the downstream port is configured to provide continuous gas flow to the foreline when the pump is on, the pump isolation valve is closed, and the reactor is not in communication with the pump.

7. The apparatus of claim 6, wherein the downstream port is further configured to provide gas flow that rapidly brings the foreline to atmospheric pressure when the pump isola- tion valve is closed and the pump is turned off.

8. The apparatus of claim 1, wherein the reactor comprises a cladding around at least a portion of the reactor.

9. The apparatus of claim 1, wherein the reactor comprises at least one independently controlled heat zone.

10. The apparatus of claim 1, further comprising at least one gas purification arrangement between the reactor and at least one source of process gas.

11. An apparatus for supplying precursor gas or vapor to an ultra-high purity background and controlling the partial pressure of said precursor gas or vapor, comprising:
a reactor having inner and outer surfaces;
wherein at least a portion of the inner surfaces define an internal volume of the reactor, and
wherein an ultra-high purity level is established within the internal volume of the reactor;
a fixture assembly positioned within the internal volume of the reactor having a surface configured to hold a substrate within the internal volume of the reactor;
at least one primary precursor gas or vapor delivery arrangement; and
at least one supplemental precursor gas or vapor delivery arrangement,
wherein the at least one primary precursor gas or vapor delivery arrangement comprises a device to sequen- tially supply the reactor with a precursor gas or vapor, and wherein a device of the at least one supplemental precursor gas or vapor delivery arrangement continu- ously supplies the reactor with a precursor gas or vapor, and
wherein a system control software is provided to control the at least one primary precursor gas or vapor delivery arrangement and the at least one supplemental precur- sor gas or vapor delivery arrangement.

12. The apparatus of claim 11, wherein the device of the at least one supplemental precursor gas or vapor delivery arrangement comprises:
a compressed gas cylinder or an ampoule in communica- tion the reactor; and
a reservoir and pressure gauge between the compressed gas cylinder or the ampoule and the reactor.

13. The apparatus of claim 12, wherein the device of the at least one supplemental precursor gas or vapor delivery arrangement further comprises:
a regulator between the compressed gas cylinder or the ampoule and the reservoir and pressure gauge;
a first orifice between the regulator and the reservoir and pressure gauge; and
a first valve between the first orifice and the reservoir and pressure gauge.

14. The apparatus of claim 13, wherein the device of the at least one supplemental precursor gas or vapor delivery arrangement further comprises:
a second orifice between the reservoir and pressure gauge and the reactor; and
a second valve between the second orifice and the reactor;
wherein the second orifice and the second valve control the flow of precursor gas or vapor from the reservoir to the reactor.

15. The apparatus of claim 13, further comprising system control software in communication with the pressure gauge and the first valve;
wherein the system control software receives feedback from the pressure gauge and cycles the first valve based on the feedback to control flow into the reservoir.

16. The apparatus of claim 11, wherein the device of the at least one supplemental precursor gas or vapor delivery arrangement comprises:
a compressed gas cylinder or an ampoule in communica- tion the reactor;
wherein a regulator, an orifice, and a valve are provided between the compressed gas cylinder or ampoule and the reactor to control the flow of a precursor gas or
vapor from the compressed gas cylinder or the ampoule
to the reactor.

17. The apparatus of claim 11, wherein the device of the
at least one supplemental precursor vapor delivery arrange-
ment comprises:

an ampoule in communication with the reactor;
wherein an orifice and a valve are provided between the
ampoule and the reactor to control the flow of precursor
vapor from the ampoule to the reactor.

* * * * *